(12) United States Patent
Chang et al.

(10) Patent No.: US 7,550,337 B2
(45) Date of Patent: Jun. 23, 2009

(54) DUAL GATE DIELECTRIC SRAM

(75) Inventors: Leland Chang, New York, NY (US);
Shreesh Narasimha, Beacon, NY (US);
Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 75 days.

(21) Appl. No.: 11/759,538

(22) Filed: Jun. 7, 2007

(65) Prior Publication Data
US 2008/0303105 A1 Dec. 11, 2008

(51) Int. Cl.
*H01L 21/8238* (2006.01)
*H01L 21/336* (2006.01)
*G11C 16/04* (2006.01)

(52) U.S. Cl. ........................ 438/199; 438/299; 438/478; 365/185.24

(58) Field of Classification Search ............ 365/185.24, 365/154, 161, 226; 438/199, 289, 478, 763
See application file for complete search history.

(56) References Cited

U.S. PATENT DOCUMENTS

| | | | | |
|---|---|---|---|---|
| 6,556,477 B2 * | 4/2003 | Hsu et al. | ............... | 365/185.08 |
| 6,723,661 B2 * | 4/2004 | Fitzergald | ................... | 438/763 |
| 7,217,949 B2 * | 5/2007 | Chan et al. | ..................... | 257/19 |
| 7,262,987 B2 * | 8/2007 | Abadeer et al. | ............. | 365/154 |
| 7,295,457 B2 * | 11/2007 | Chan et al. | .................. | 365/154 |
| 7,408,800 B1 * | 8/2008 | Braceras et al. | ............. | 365/154 |
| 2006/0084247 A1 * | 4/2006 | Liu | ............................ | 438/510 |
| 2006/0208323 A1 * | 9/2006 | Anderson et al. | ........... | 257/392 |
| 2007/0164365 A1 * | 7/2007 | Chan et al. | .................. | 257/369 |

* cited by examiner

*Primary Examiner*—Howard Weiss
*Assistant Examiner*—Steven H Rao
(74) *Attorney, Agent, or Firm*—Scully, Scott, Murphy & Presser, P.C.; Ido Tuchman, Esq.

(57) ABSTRACT

An SRAM cell structure containing a PFET gate dielectric having a thicker effective oxide thickness (EOT) than an NFET gate dielectric and methods of manufacturing the same is provided. The PFET gate dielectric and the NFET gate dielectric may be silicon oxynitride layers, CVD oxide layers, or high-K dielectric layers having different thicknesses. The PFET gate dielectric may be a stack of two dielectric layers and the NFET gate dielectric may be one of the two dielectric layers. The greater EOT of the PFET gate dielectric produces reduction of the on-current of the pull-up PFETs for optimal SRAM performance.

10 Claims, 22 Drawing Sheets

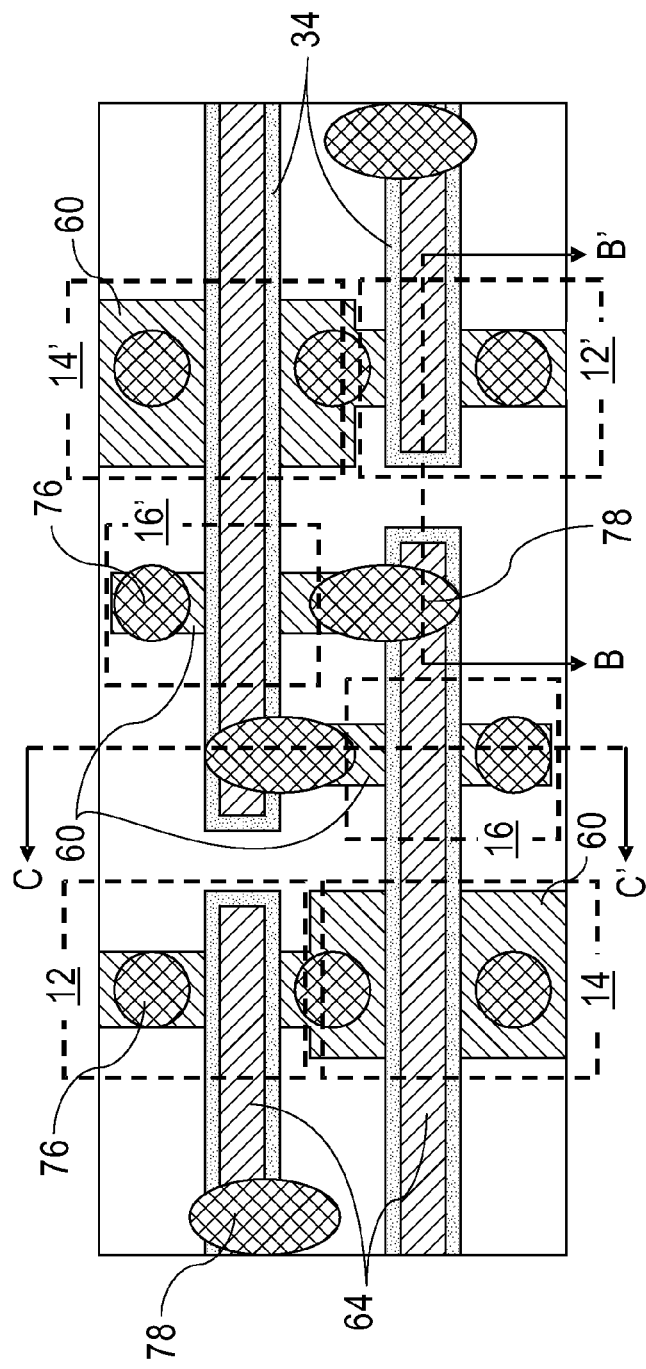
FIG. 1A
Prior Art
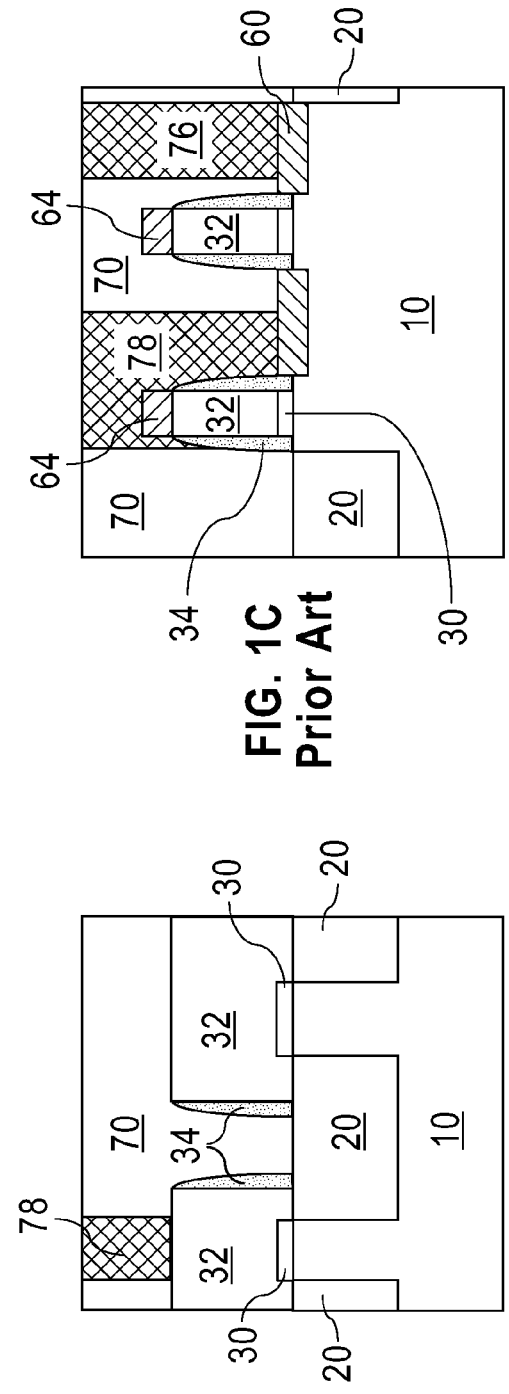
FIG. 1C
Prior Art
FIG. 1B
Prior Art

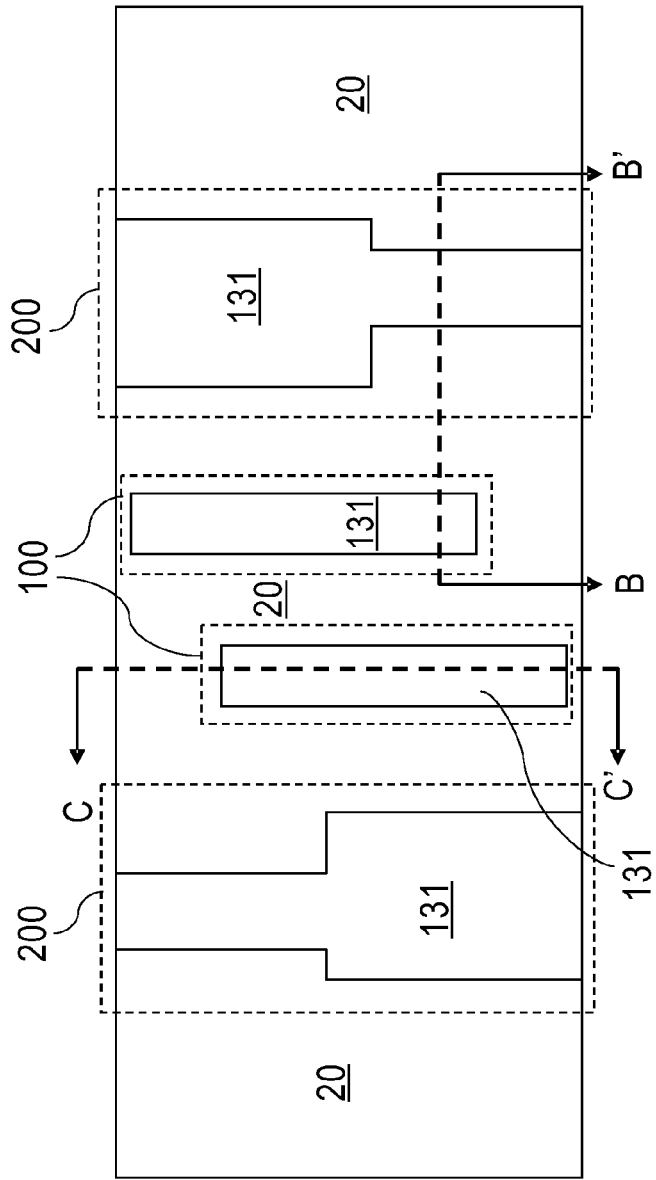
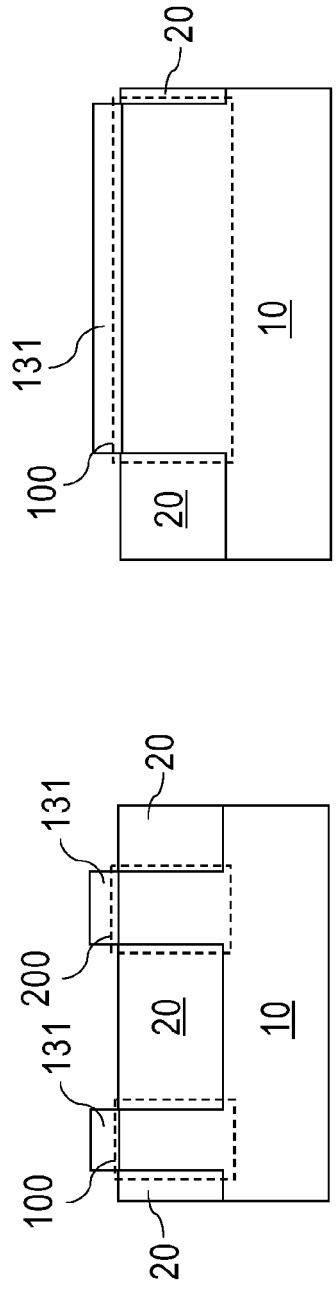
FIG. 4A
FIG. 4B
FIG. 4C

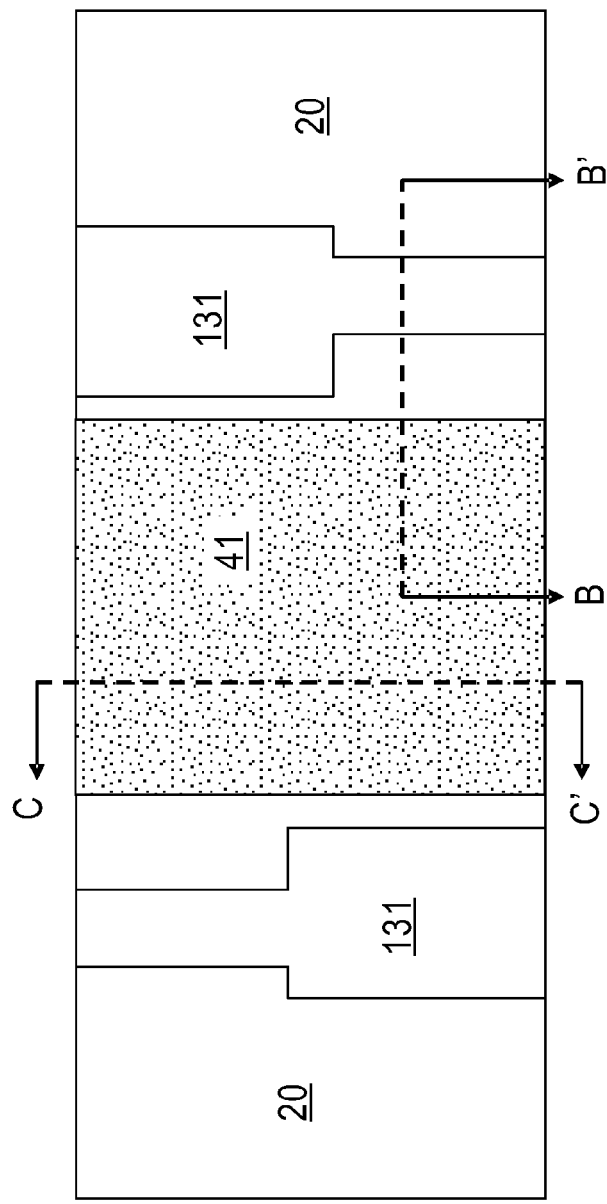
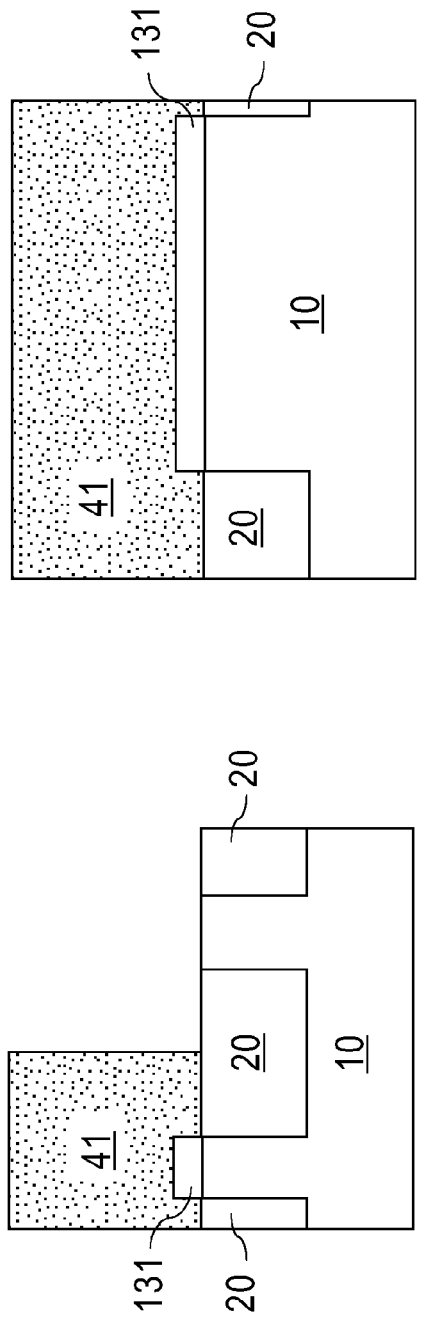
FIG. 5A
FIG. 5B
FIG. 5C

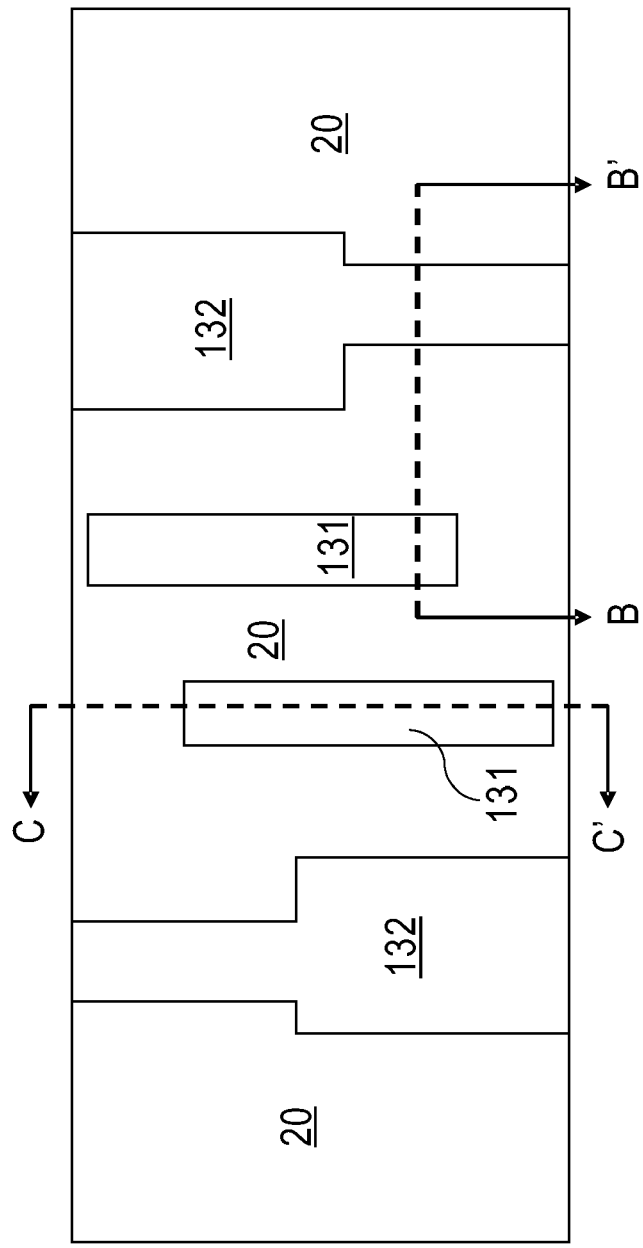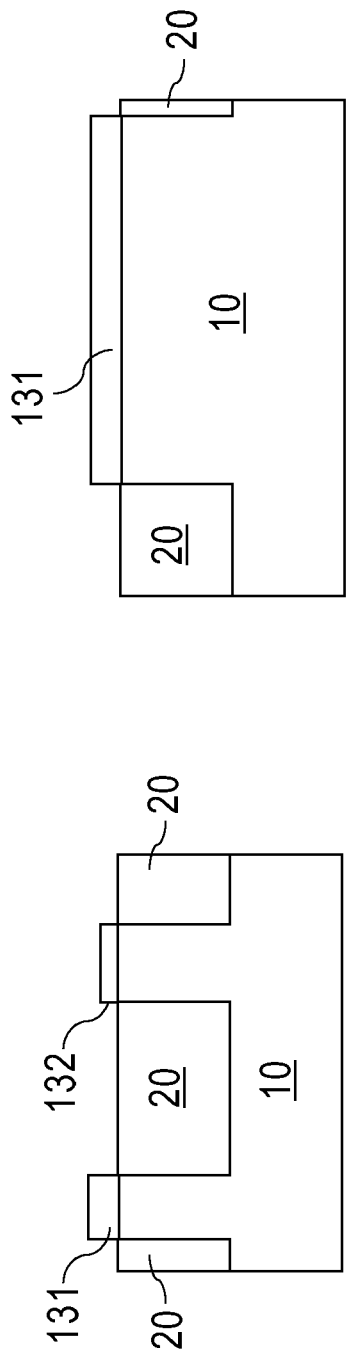

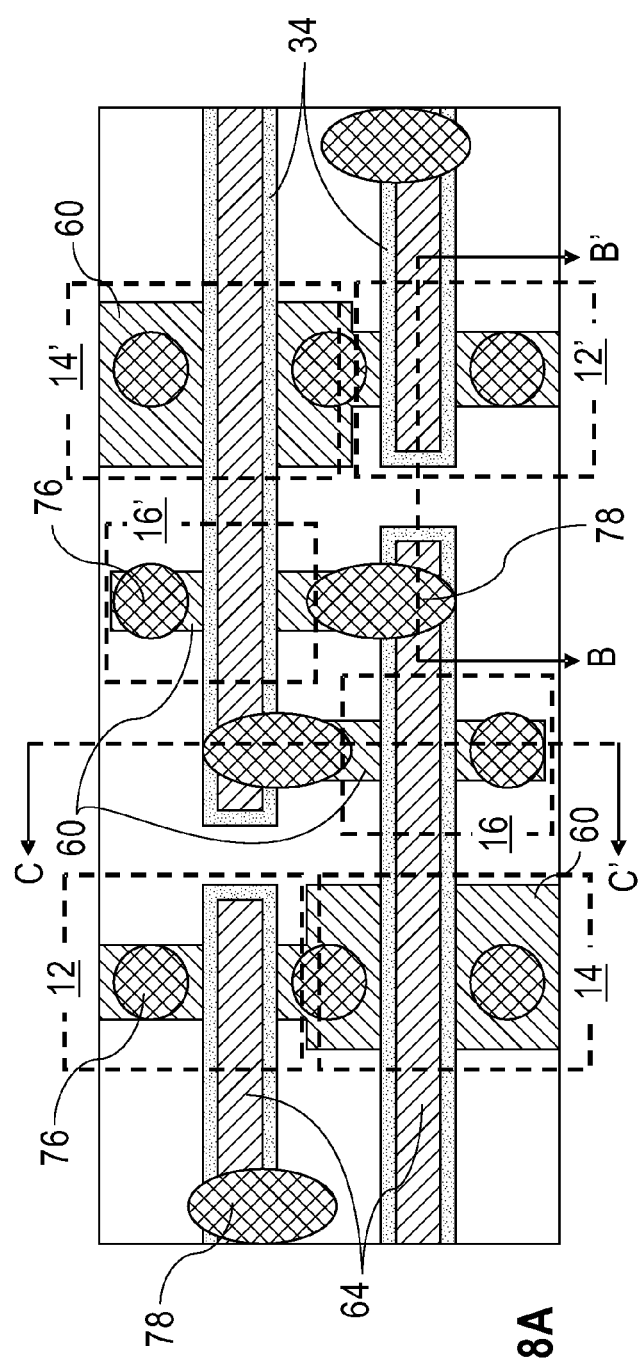
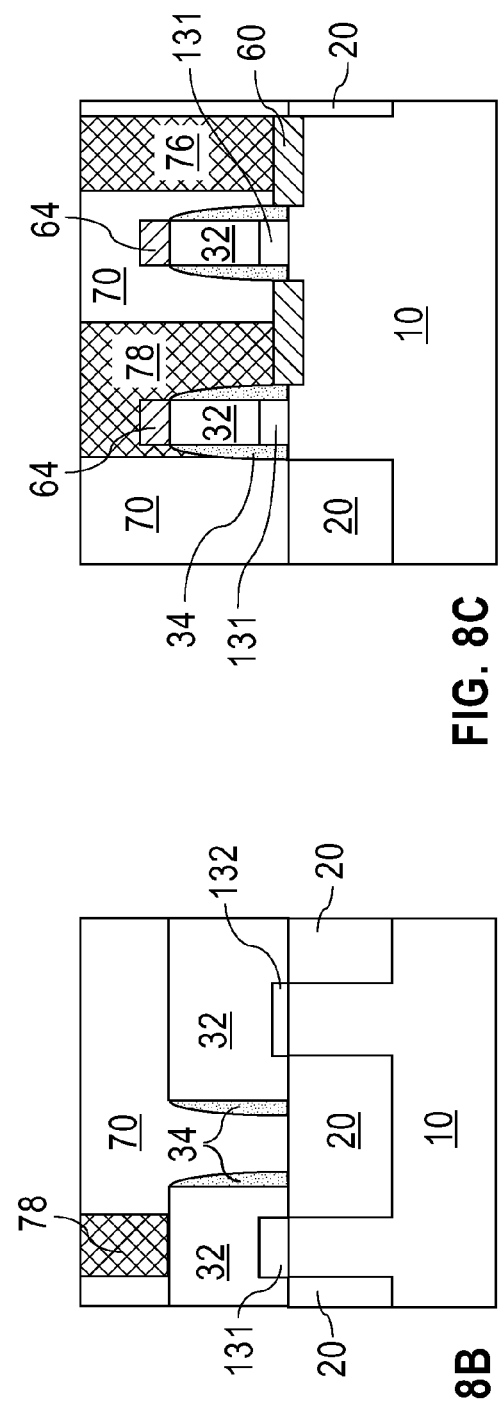
FIG. 8A
FIG. 8B
FIG. 8C

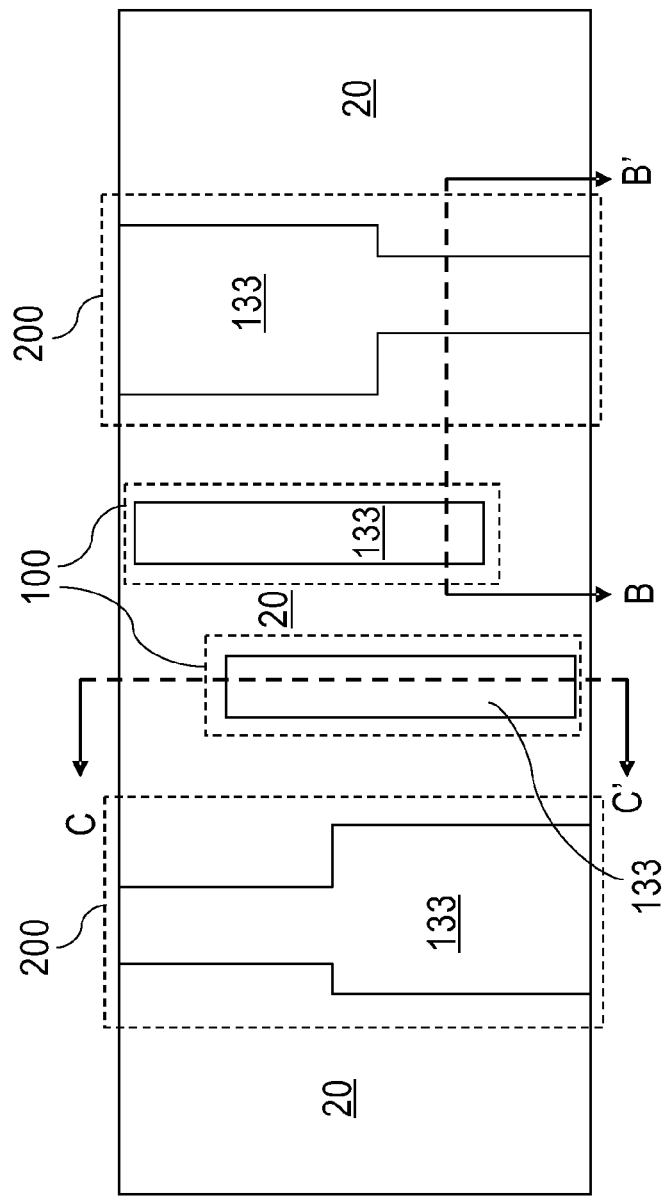
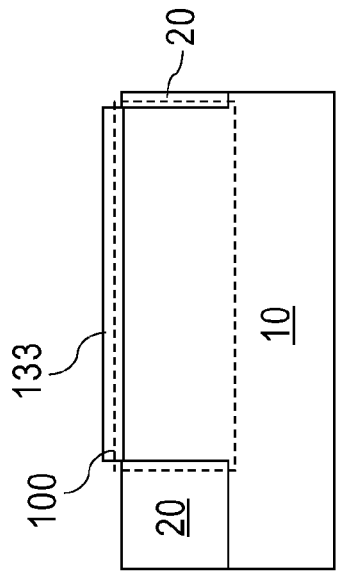
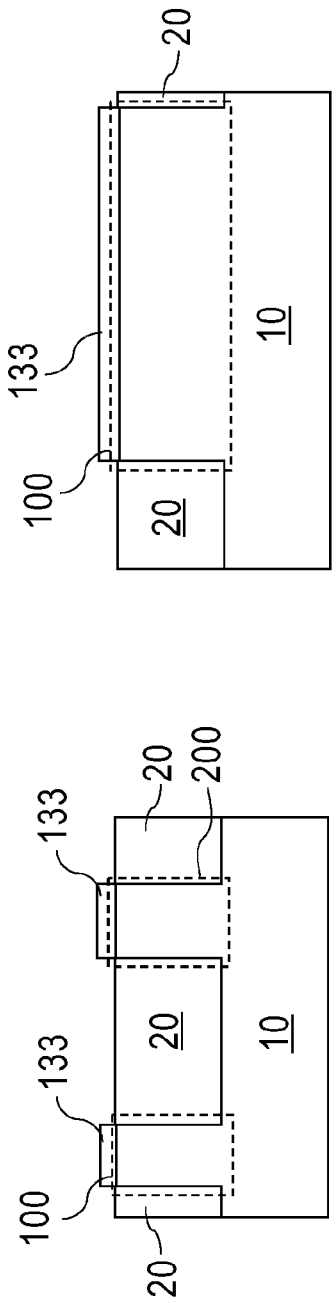
FIG. 9A
FIG. 9C
FIG. 9B

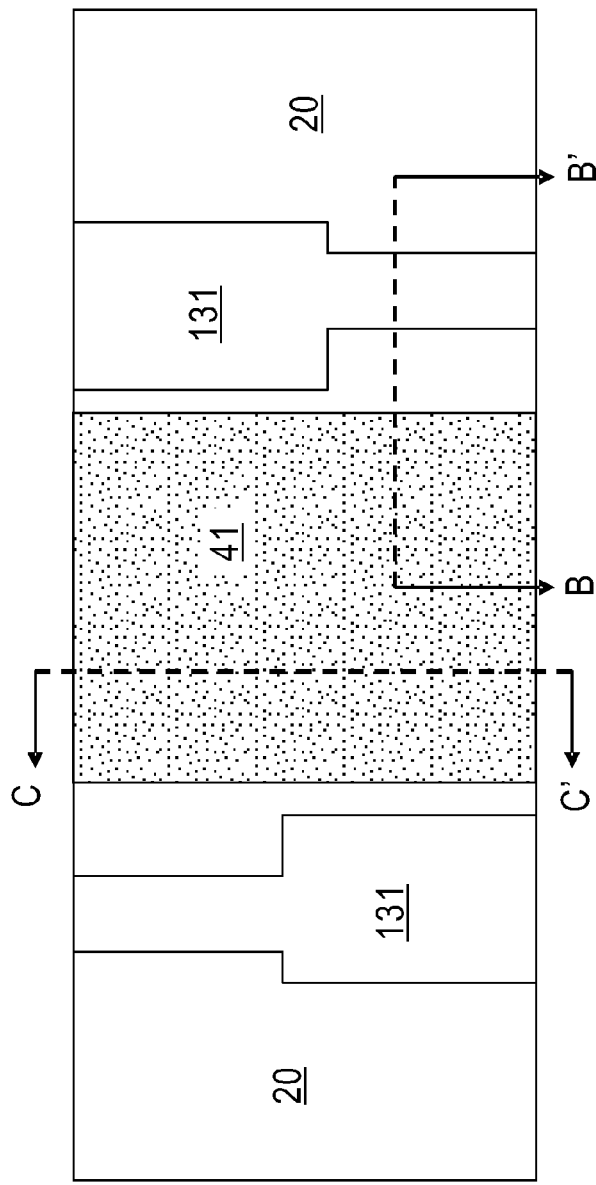
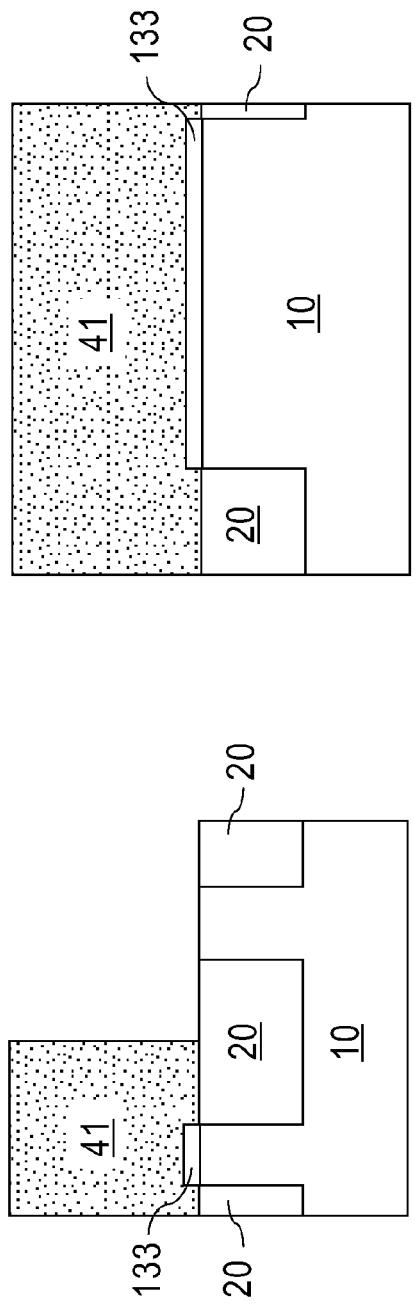
FIG. 10A
FIG. 10B
FIG. 10C

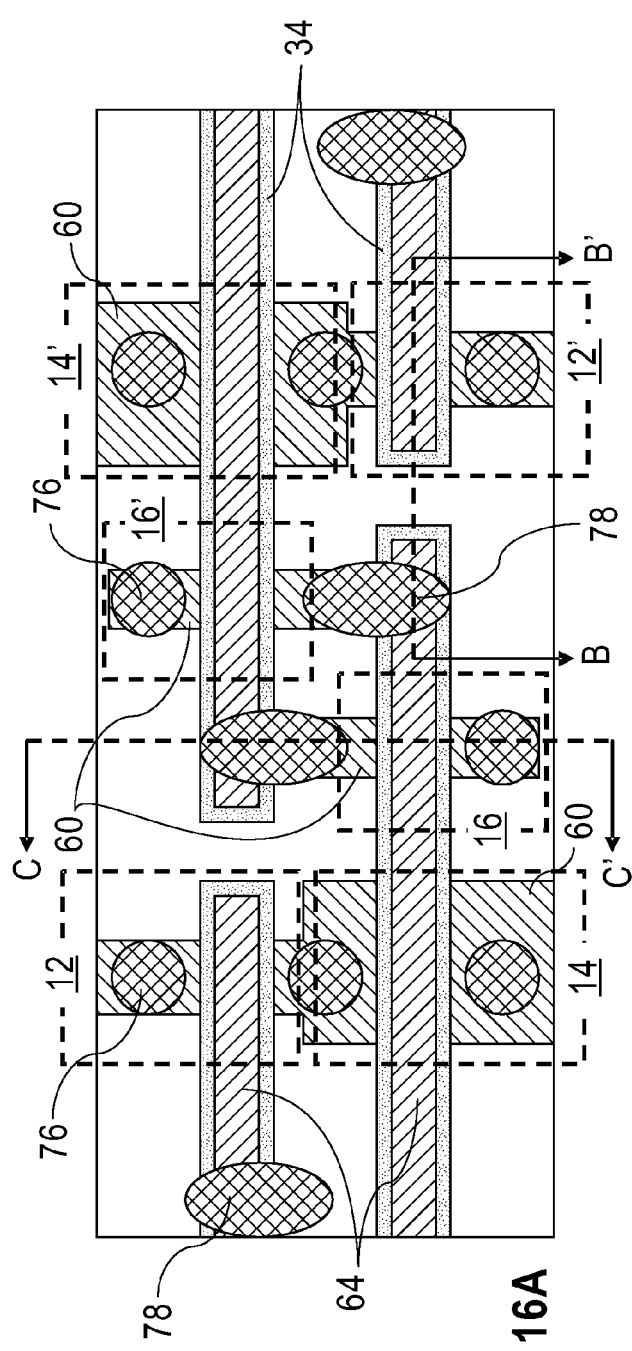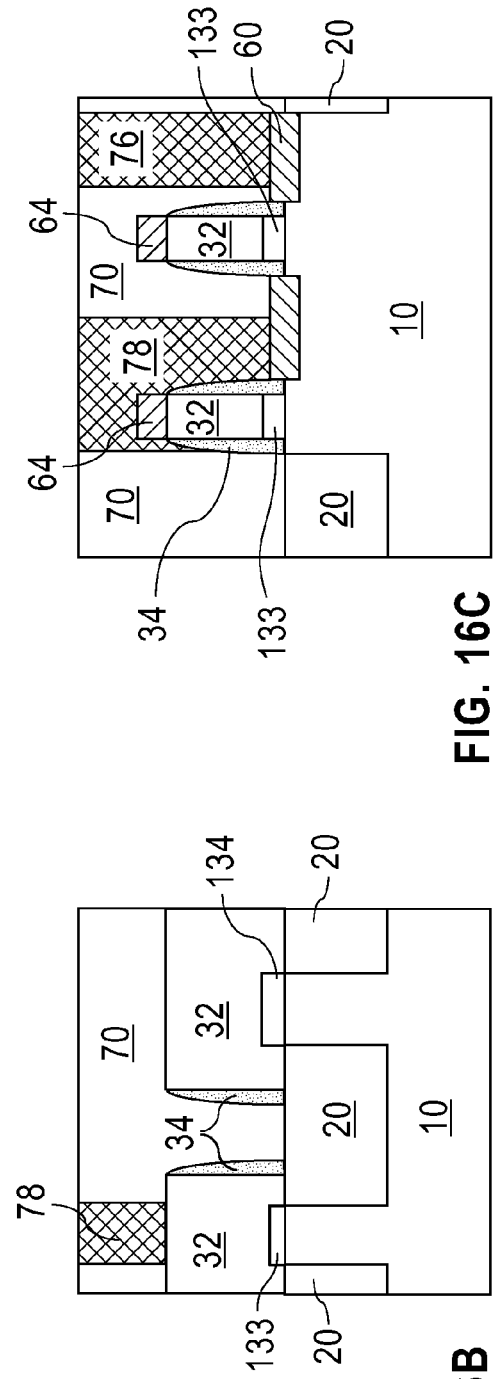
FIG. 16A
FIG. 16B
FIG. 16C

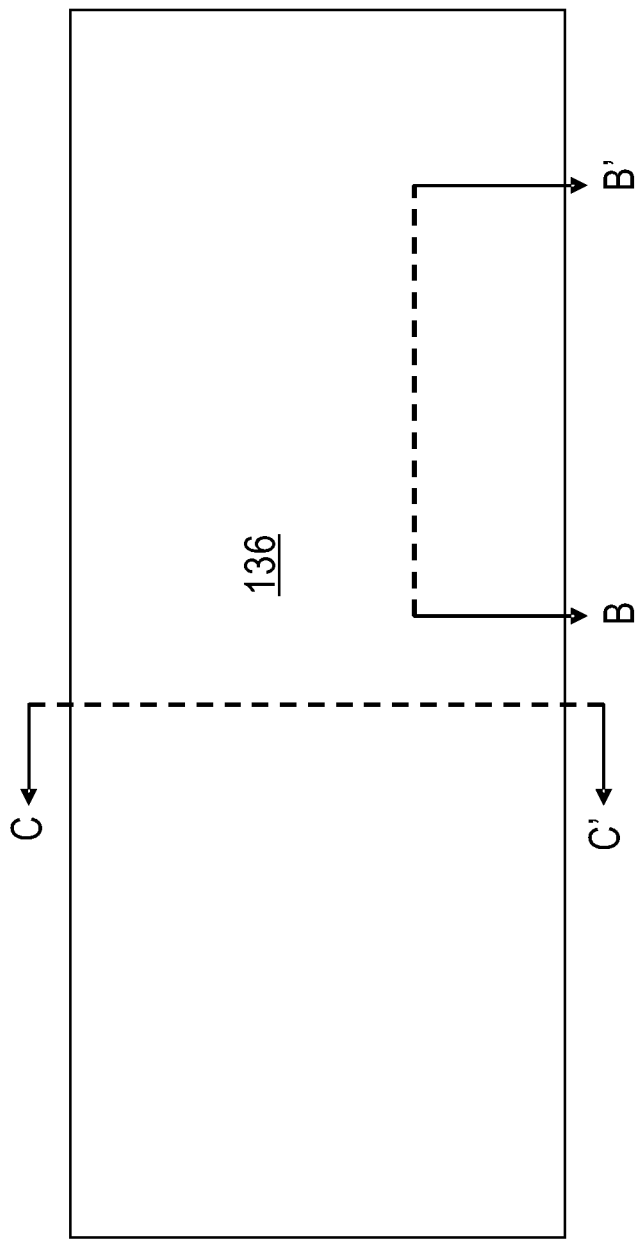
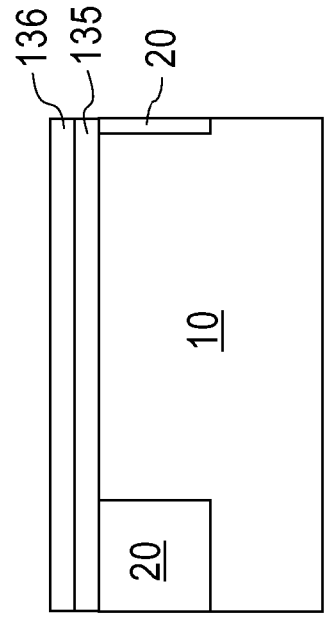
FIG. 17C
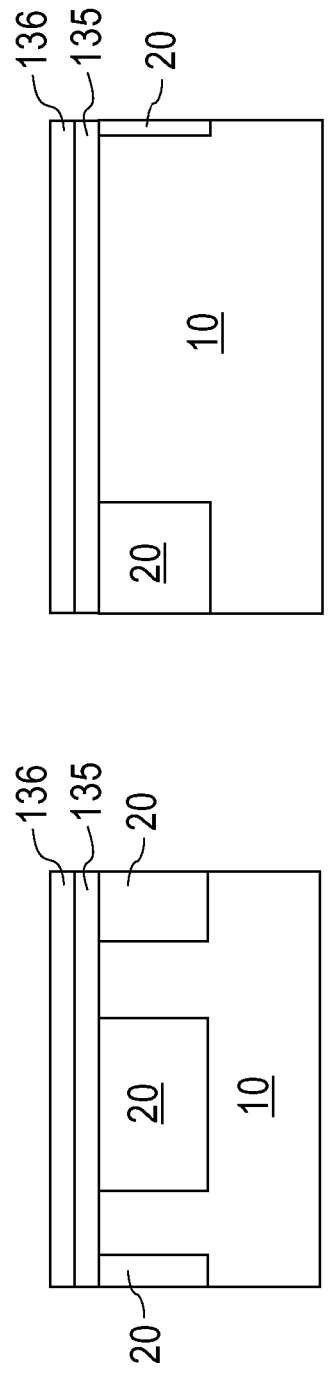
FIG. 17A
FIG. 17B

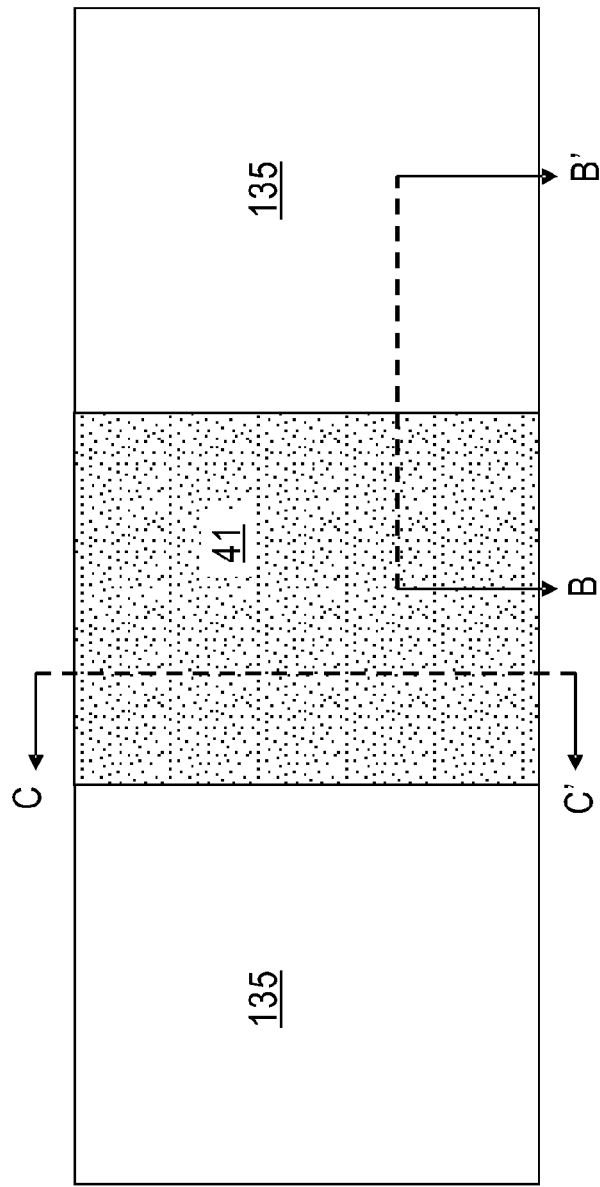
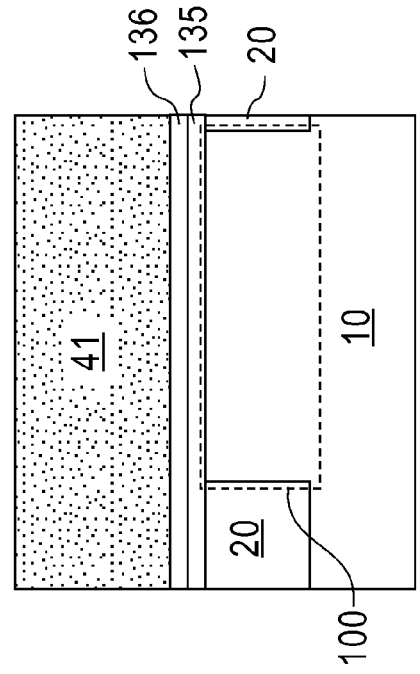
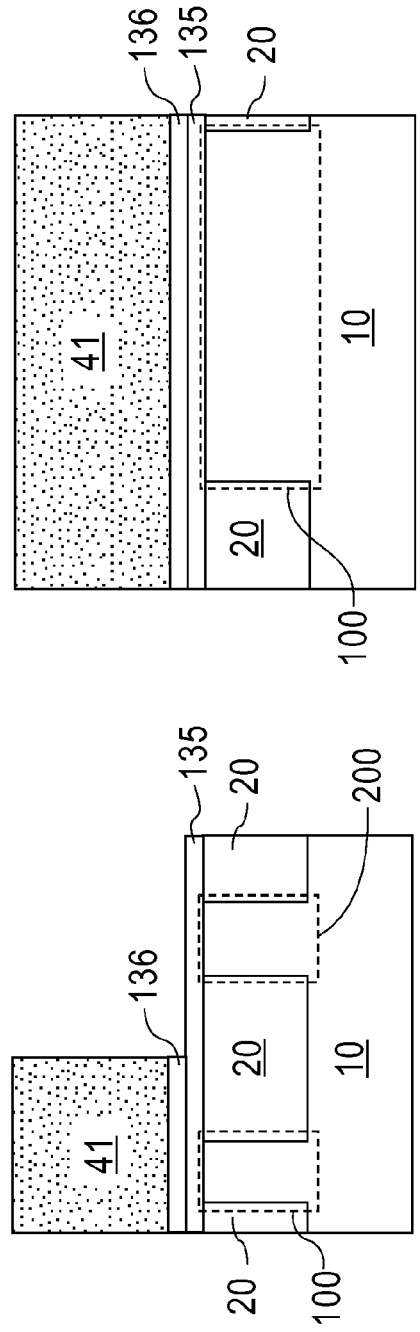
FIG. 18A
FIG. 18C
FIG. 18B

US 7,550,337 B2

DUAL GATE DIELECTRIC SRAM

FIELD OF THE INVENTION

The present invention relates to semiconductor structures, and particularly to static random access memory (SRAM) structures having dual gate dielectrics and methods of manufacturing the same.

BACKGROUND OF THE INVENTION

Conventional complementary metal-oxide-semiconductor (CMOS) devices offer higher on-current for n-type field effect transistors (NFETs) than for p-type field effect transistors (PFETs) having similar physical dimensions. This is, in general, due to higher electron mobility than hole mobility in most semiconductor materials. In the case of a silicon substrate having a (100) surface, the ratio of electron mobility to hole mobility is about 2. Correspondingly, semiconductor circuits have been designed to factor in the differences in the on-current per unit width of NFETs and PFETs.

Static random access memory (SRAM) is a memory device employing six transistors. SRAM cell design typically begins by picking the smallest PFET supported by a given technology for two pull-up PFETs, followed by scaling of NFET pass gate transistors and pull-down NFET transistors for optimal beta ratio, cell stability, and access time.

Referring to FIG. 1A-1C, an exemplary prior art SRAM structure comprises a first pull-up PFET 16, a second pull-up PFET 16', two pull down NFETs (14, 14'), and two pass gate NFETs (12, 12'). FIG. 1A is a top-down view of the exemplary prior art structure up to the CA level not showing a middle-of-line (MOL) dielectric 70. FIG. 1B is a vertical cross-sectional view of the exemplary prior structure along the plane B-B' showing the MOL dielectric 70. FIG. 1C is a vertical cross-sectional view of the exemplary prior structure along the plane C-C' showing the MOL dielectric 70. Each of the transistors (12, 12', 14, 14', 16, 16') comprise a portion of the semiconductor substrate 10, a gate dielectric 30, a gate conductor 32, a gate spacer 34, active area (AA) silicides 60, and gate top silicides 64. Shallow trench isolation 20 physically separates the transistors (12, 12', 14, 14', 16, 16') and provides electrical isolation among the transistors (12, 12', 14, 14', 16, 16'). CA contact vias 76 and CA bars 78 are employed to provide electrical wiring among the transistors (12, 12', 14, 14', 16, 16'). One of the CA bars 78, which contacts one of the AA silicides 60 of the first pull-up PFET 16 as well as the gate top silicides 64 of the second pull-up PFET 16' as shown in FIG. 1B, provides electrical connection between the drain of the first pull-up PFET 16 and the gate of the second pull-up PFET 16'. Likewise, another CA bar 78 provides electrical connection between the drain of the second pull-up PFET 16' and the gate of the first pull-up PFET 16.

Referring to FIGS. 2A-2C, the exemplary prior art SRAM structure is shown up to the M1 level. FIG. 2A is a top-down view of the exemplary prior art structure up to the M1 level not showing the middle-of-line (MOL) dielectric 70 and an M1 dielectric 80. FIG. 2B is a vertical cross-sectional view of the exemplary prior structure along the plane B-B' showing the MOL dielectric 70 and the M1 dielectric 80. FIG. 2C is a vertical cross-sectional view of the exemplary prior structure along the plane C-C' showing the MOL dielectric 70 and the M1 dielectric 80. M1 wires 88 embedded within the M1 dielectric 80 contact the underlying CA contact vias 76 and the CA bars 78. In the exemplary prior art SRAM structure, FIGS. 2A and 2C illustrate that the drain of each of the two pull-up transistors (16, 16') is electrically connected to a node at which a source/drain of one of the pass gate transistors (12, 12') adjoins the drain of one of the pull-down NFETs (14, 14') by a combination of a CA bar 78, an M1 wire 88, and a CA contact via 76. Two such combinations are present in each SRAM cell structure which comprises six transistors (12, 12', 14, 14', 16, 16').

Referring to FIG. 3, a circuit schematic 18 for the exemplary prior art SRAM structure shows a first pair of a first pass gate n-type field effect transistor (NFET) 2 and a first pull-down n-type field effect transistor (NFET) 4 wherein a first source/drain of the first pass gate NFET 2 and a first drain of the first pull down NFET 4 are adjoined to form an electrical connection. In the physical structure, this electrical connection is achieved by a first common active area that contains both the first source/drain of the first pass gate NFET 2 and the first drain of the first pull-down NFET 4. Similarly, a second source/drain of the second pass gate NFET 2' and a second drain of a second pull-down NFET 4' are adjoined to form another electrical connection. In the physical structure, this electrical connection is achieved by a second common active area that contains both the second source/drain of the second pass gate NFET 2' and the second drain of the second pull-down NFET 4'. The circuit schematic 18 further comprises a first pull-up p-type field effect transistor (PFET) 6 containing a third drain, which is physically a third active area, and a second pull-up PFET 6' containing a fourth drain, which is physically a fourth active area. Each of the source/drain nodes of the pass gate transistors (2, 2') may function as a source or a drain depending on the operation of the SRAM circuit.

The third active area is electrically connected to the first active area via a collection of a first contact via, a first M1 wire, and a first CA bar. This connection is represented in the circuit schematic 18 by a first internal node 11. Similarly, the fourth active area is electrically connected to the second active area via a collection of a second contact via, a second M1 wire, and a second CA bar. This connection is represented in the circuit schematic 18 by a second internal node 11'. The gates of the second pull-up PFET 6' and the second pull-down NFET 4' are adjoined to the third drain of the first pull-up PFET 6 via the first CA bar. This connection is represented in the circuit schematic 18 by a third internal node 13A and a fourth internal node 13B. The gates of the first pull-up PFET 6 and the first pull-down NFET 4 are adjoined to the fourth drain of the second pull-up PFET 6' via the first CA bar. This connection is represented in the circuit schematic 18 by a fifth internal node 13A' and a sixth internal node 13B'. The internal nodes (11 11', 13A, 13B, 13A' 13B') are connected by CA contact vias 76 and CA bars 78 as well as M1 wires 88. Bit line wiring (15, 15') and word line wiring (17, 17') are typically implemented at M2 and M3 levels.

Recent advances in stress engineering, such as embedded SiGe structures and compressive stress liners, have increased on-current of PFETs much more than on-current of NFETs. This has resulted in degradation of writeability margins in existing SRAM cell designs because the NFET pass gate transistors have become relatively weak in comparison with pull-up PFETs during a write event.

A new SRAM design is a costly and time-consuming proposition since many rounds of thorough simulation and hardware verification may be necessary to optimize and verify all aspects of functionality of the new SRAM design. Therefore, methods of tuning SRAM performance by tuning process parameters are desired.

One approach to solve this problem may be to increase the widths of the pass gate NFETs and pull-down NFETs. This would result in an undesirable consequence of an increased cell size. Another approach may be to reduce the threshold voltage (Vt) of NFETs to address the writability concerns. However, this would result in an increased leakage current and standby power consumption. Yet another approach may be to weaken the pull-up PFETs by raising the threshold voltage of the pull-up PFETs. This would degrade cell stability and limit the operability of an SRAM array at a lower power supply voltage Vdd.

In view of the above, there exists a need for a structure having a reduced on-current for pull-up PFETs in an SRAM cell without affecting the other transistor parameters in a significant manner and methods of manufacturing the same.

SUMMARY OF THE INVENTION

The present invention addresses the needs described above by providing an SRAM cell structure in which pull-down NFETs and pass gate NFETs comprise an NFET gate dielectric, while pull-up PFETs comprise a PFET gate dielectric, such that the PFET gate dielectric provides a thinner effective oxide thickness (EOT) than the NFET gate dielectric, and methods of manufacturing the same.

Each of the NFET gate dielectric and PFET gate dielectric may be a silicon oxynitride dielectric, a high-k dielectric, or a stack thereof. The PFET gate dielectric may be a thick layer of silicon oxynitride and the NFET gate dielectric may be a thin layer of silicon oxynitride. The PFET gate dielectric may be a thick layer of a high-K dielectric material and the NFET gate dielectric may be a thin layer of the same high-K dielectric material. The PFET gate dielectric may be a thick layer of a CVD oxide and the NFET gate dielectric may be a thin layer of the same CVD oxide. The PFET gate dielectric may be a stack of a layer of silicon oxynitride and a layer of a high-K dielectric and the NFET gate dielectric may be a layer of the same high-K dielectric. The PFET gate dielectric may be a layer of silicon oxynitride and the NFET gate dielectric may be a layer of a high-K dielectric. The PFET gate dielectric may be a stack of a layer of a high-K dielectric and a CVD oxide and the NFET gate dielectric may be a layer of the same high-K dielectric. The greater EDT of the PFET gate dielectric produces reduction of the on-current of the pull-up PFETs for optimal SRAM performance.

According to an aspect of the present invention, a static random access memory (SRAM) cell structure is provided, which comprises:

two pull-up p-type field effect transistors (PFETs) containing a PFET gate dielectric having a first equivalent oxide thickness (EOT); and two pull-down n-type field effect transistors (NFETs) containing an NFET gate dielectric having a second equivalent oxide thickness (EOT), wherein the first EOT is greater than the second EOT.

In one embodiment, the SRAM cell structure further comprises two pass gate n-type field effect transistors (NFETs) containing the NFET gate dielectric.

In another embodiment, the PFET gate dielectric comprises a first layer of thermal dielectric material having a first thickness and the NFET gate dielectric comprises a second layer of the thermal dielectric material having a second thickness, and wherein the thermal dielectric material is selected from the group consisting of thermal silicon oxide, thermal silicon nitride, thermal silicon oxynitride, and a stack thereof.

In yet another embodiment, the PFET gate dielectric comprises a stack of a layer of thermal dielectric material and a high-K dielectric material layer having a thickness and the NFET gate dielectric comprises another high-K dielectric material layer having the thickness.

In still another embodiment, the layer of thermal dielectric material abuts the semiconductor substrate.

In still another embodiment, the high-K dielectric material is selected from the group consisting Of $HfO_2$, $ZrO_2$, $Al_2O_3$, $TiO_2$, $La_2O_3$, $SrTiO_3$, $LaAlO_3$, $Y_2O_3$, mixtures thereof, and silicates thereof.

In a further embodiment, the PFET gate dielectric consists of a layer of thermal dielectric material and the NFET gate dielectric comprises a high-K dielectric material layer.

In another further embodiment, the high-K dielectric material is selected from the group consisting of $HfO_2$, $ZrO_2$, $Al_2O_3$, $TiO_2$, $La_2O_3$, $SrTiO_3$, $LaAlO_3$, $Y_2O_3$, mixtures thereof, and silicates thereof.

In yet another further embodiment, the PFET gate dielectric comprises a stack of a first high-K dielectric material layer and a second high-K dielectric material layer and the NFET gate dielectric comprises the first high-K dielectric material layer.

In still another further embodiment, the PFET gate dielectric comprises a stack of a first high-K dielectric material layer and a chemical vapor deposition (CVD) dielectric layer and the NFET gate dielectric comprises the first high-K dielectric material layer, wherein the CVD dielectric layer comprises a material selected from silicon oxide, silicon nitride, and silicon oxynitride.

According to another aspect of the present invention, a method of manufacturing a static random access memory cell is provided, the method comprises:

providing two p-type field effect transistor (PFET) active areas and two n-type field effect transistor (NFET) active areas on a semiconductor substrate;

forming a PFET gate dielectric on the PFET active areas, wherein the PFET gate dielectric has a first equivalent oxide thickness (EOT); and forming an NFET gate dielectric on the NFET active areas, wherein the NFET gate dielectric has a second equivalent oxide thickness (BOT), and wherein the first EOT is greater than the second EOT.

In one embodiment, the forming of the PFET gate dielectric comprises forming a thermal dielectric material layer containing a thermal dielectric material on the PFET active areas and the NFET active areas, wherein the thermal dielectric material is selected from the group consisting of thermal silicon oxide, thermal silicon nitride, thermal silicon oxynitride, and a stack thereof The forming of the NFET gate dielectric comprises:

removing the thermal dielectric material layer from above the NFET active areas, and forming another thermal dielectric material layer comprising another thermal dielectric material, wherein the another thermal dielectric material is selected from the group consisting of thermal silicon oxide, thermal silicon nitride, thermal silicon oxynitride, and a stack thereof.

In another embodiment, the thermal dielectric material is different from the another thermal dielectric material.

In yet another embodiment, the forming of the PFET gate dielectric comprises:

forming a thermal dielectric material layer containing a thermal dielectric material on the PFET active areas and the NFET active areas, wherein the thermal dielectric material is selected from the group consisting of thermal silicon oxide, thermal silicon nitride, thermal silicon oxynitride, and a stack thereof, and forming a high-K dielectric material layer directly on the thermal dielectric layer above the PFET active areas;

and the forming of the NFET gate dielectric comprises:

removing the thermal dielectric material layer from above the NFET active areas, and forming the high-K dielectric material layer directly on the NFET active areas.

In still another embodiment, the high-K dielectric material layer comprises a material selected from the group consisting of $HfO_2$, $ZrO_2$, $Al_2O_3$, $TiO_2$, $La_2O_3$, $SrTiO_3$, $LaAlO_3$, $Y_2O_3$, mixtures thereof and silicates thereof.

In still another embodiment, the method further comprises removing the high-K dielectric material layer from above the PFET active areas.

In a further embodiment, the forming of the PFET gate dielectric comprises:

forming a first high-K dielectric material layer directly on the PFET active areas and the NFET areas, and forming a second high-K dielectric material layer directly on the first high-K dielectric material layer above the PFET areas and the NFET areas;

and the forming of the NFET gate dielectric comprises removing the second high-K dielectric material layer from above the NFET active areas.

In a further embodiment, each of the first high-K dielectric material layer and the second high-K dielectric material layer comprises a material selected from the group consisting of $HfO_2$, $ZrO_2$, $Al_2O_3$, $TiO_2$, $La_2O_3$, $SrTiO_3$, $LaAlO_3$, $Y_2O_3$, mixtures thereof, and silicates thereof.

In another further embodiment, the first high-K dielectric material layer and the second high-K dielectric material layer comprise different materials.

In yet further embodiment, the forming of the PFET gate dielectric comprises:

forming a high-K dielectric material layer directly on the PFET active areas and the NFET areas, forming a chemical vapor deposition (CVD) dielectric layer directly on the first high-K dielectric material layer above the PFET areas and the NFET areas by chemical vapor deposition; and the forming of the NFET gate dielectric comprises removing the CVD dielectric layer from above the NFET active areas.

BRIEF DESCRIPTION OF THE DRAWINGS

FIGS. 1A-1C and 2A-2C show an exemplary prior art SRAM structure. FIGS 1A-1C show the exemplary prior art SRAM structure up to the CA level. FIGS. 2A-2C show the exemplary prior art SRAM structure up to the M1 level. FIGS. 1A and 2A are top down views in which a middle-of-line (MOL) dielectric 70 and an M1 dielectric 80 are not shown. FIGS. 1B and 2B are vertical cross-sectional views of the exemplary prior structure along the plane B-B' showing the MOL dielectric 70. FIGS. 1C and 2C are vertical cross-sectional views of the exemplary prior structure along the plane C-C' showing the MOL dielectric 70 and the M1 dielectric 80.

FIGS. 4A-8C are sequential views of a first exemplary SWAM cell structure according to a first embodiment of the present invention at various stages of manufacture. Figures with the same numeric label correspond to the same stage of manufacturing. Figures with the suffix "A" are top-down views. Figures with the suffix "B" or "C" are vertical cross-sections corresponding to the plane B-B' or to the plane C-C', respectively.

FIGS. 9A-13C are sequential views of a second exemplary SRAM cell structure according to a second embodiment of the present invention at various stages of manufacture. Conventions for numeric labels and suffixes are the same as for FIGS. 4A-8C.

FIGS. 14A-16C are sequential views of a third exemplary SRAM cell structure according to a third embodiment of the present invention at various stages of manufacture. Conventions for numeric labels and suffixes are the same as for FIGS. 4A-8C.

FIGS. 17A-20C are sequential views of a fourth exemplary SRAM cell structure according to a fourth embodiment of the present invention at various stages of manufacture. Conventions for numeric labels and suffixes are the same as for FIGS. 4A-8C.

DETAILED DESCRIPTION OF THE INVENTION

Figure 2A:
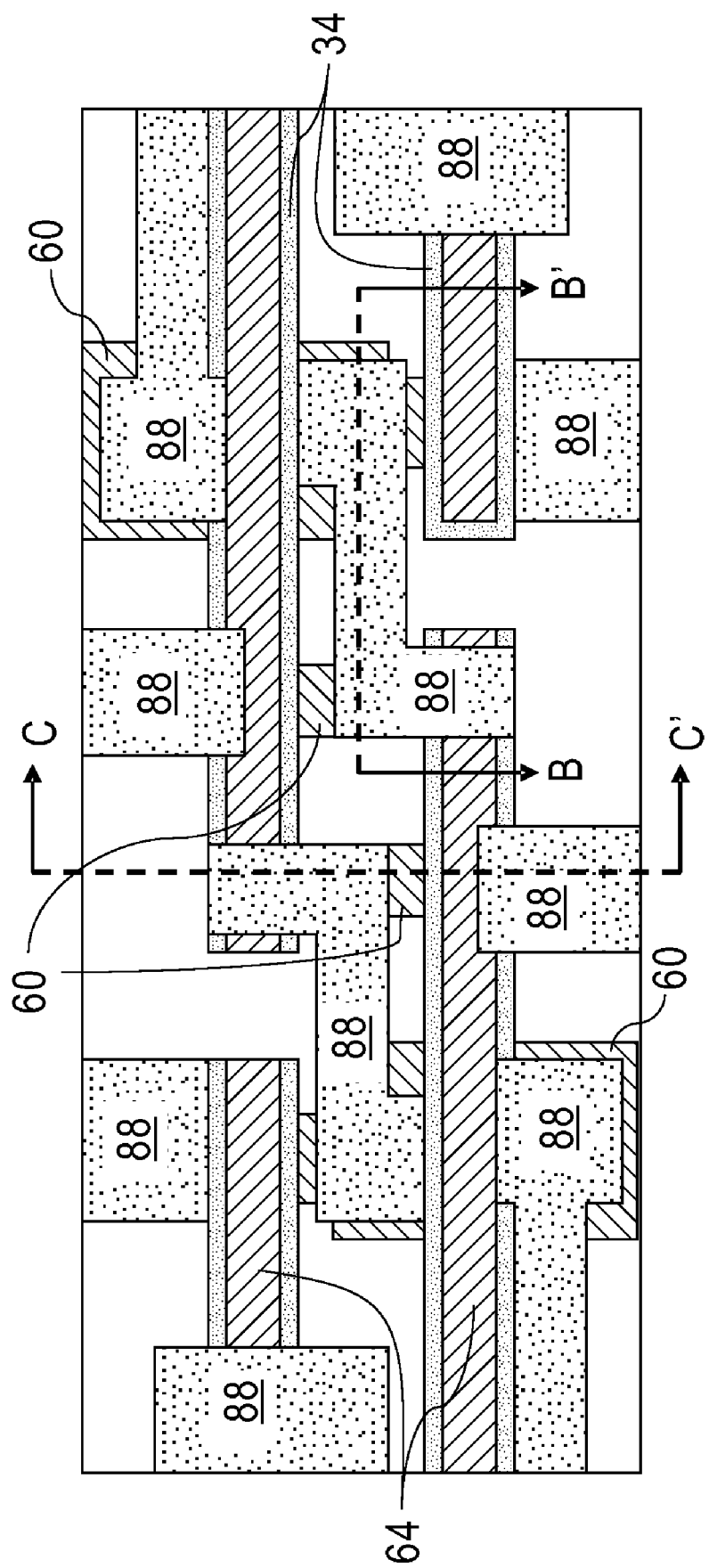
Figure 2C:
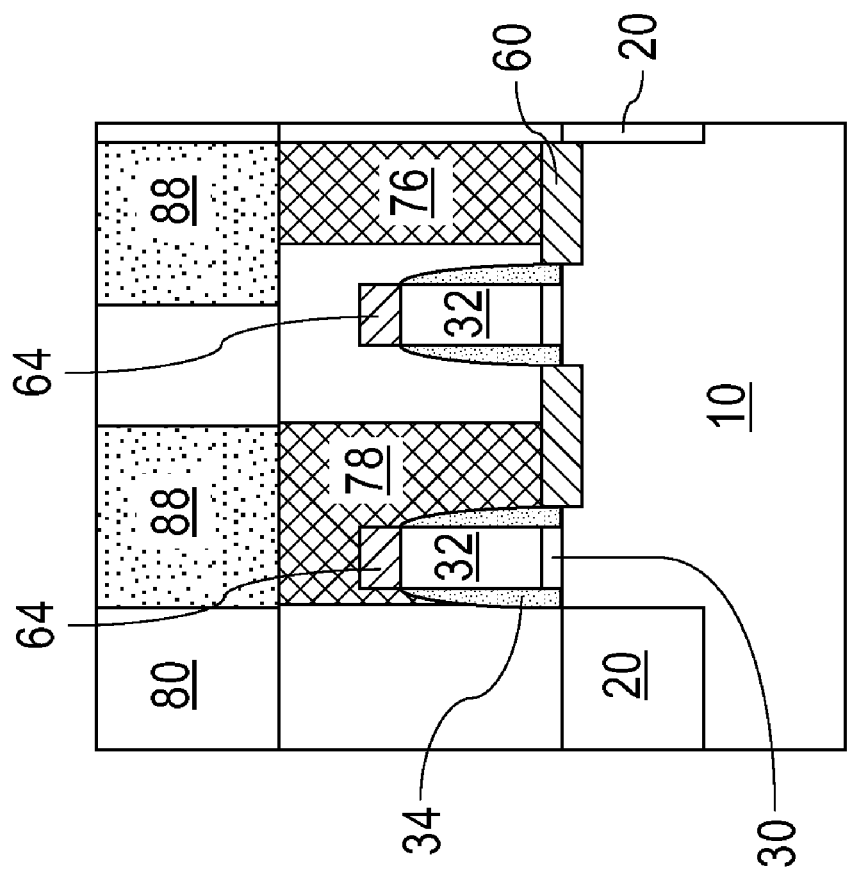
Figure 2B:
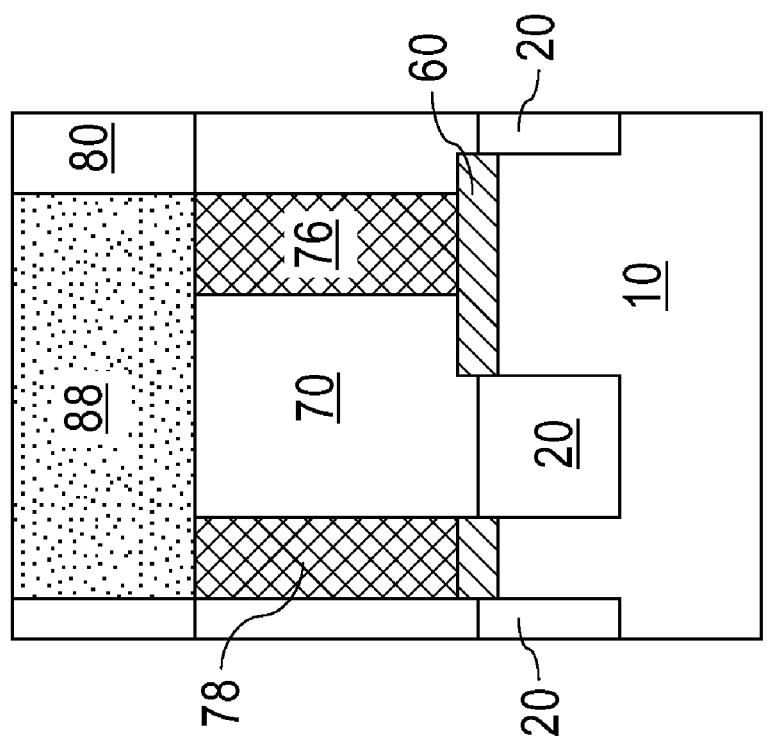
Figure 3:
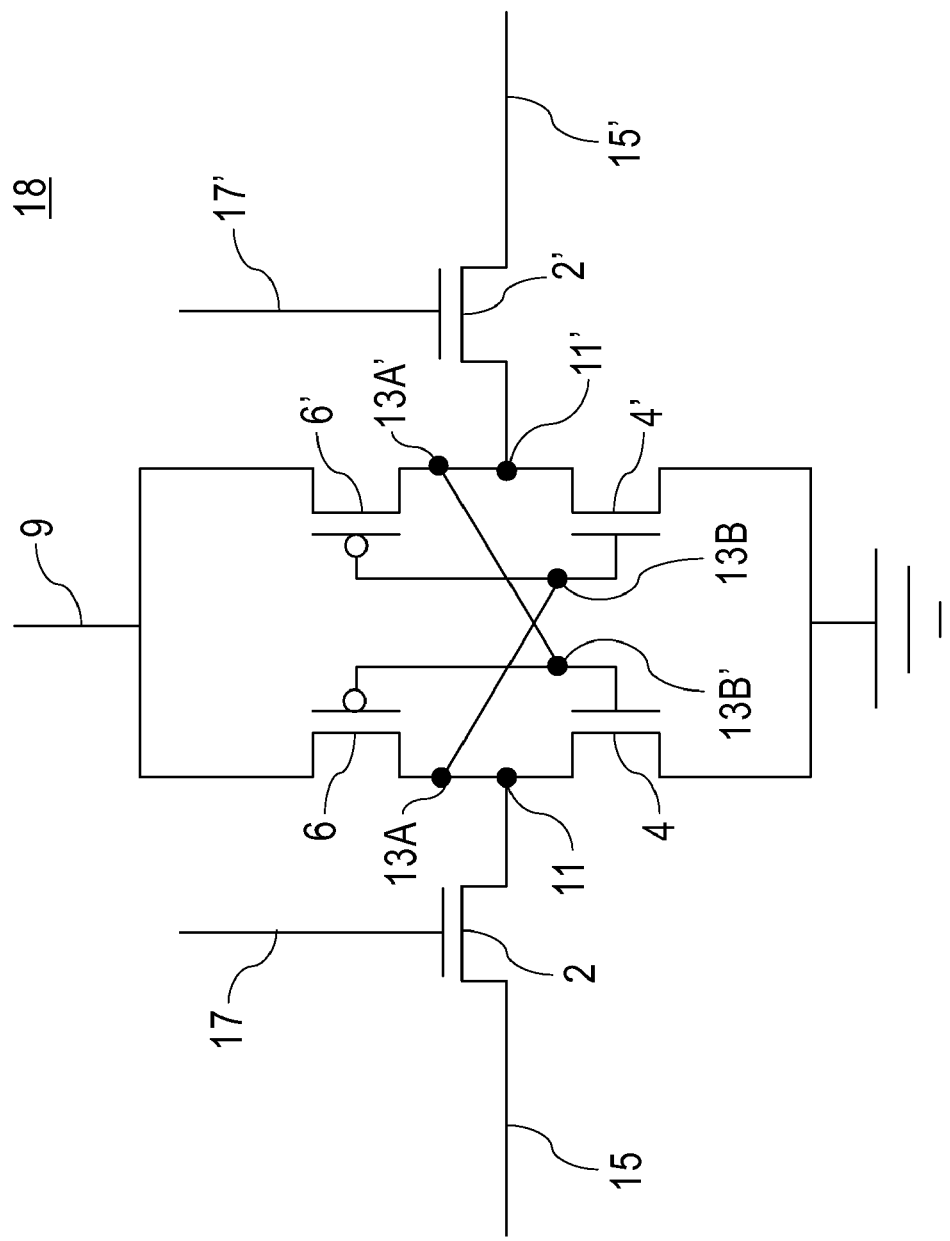
FIG. 3 is a circuit schematic for the exemplary prior art SRAM structure.

As stated above, the present invention relates to static random access memory (SRAM) structures having dual gate dielectrics and methods of manufacturing the same, which are now described in detail with accompanying figures.

Exemplary SRAM cell structures are used to describe the elements of the present invention. The use of the exemplary SRAM cell structure in the description of the present invention does not limit the application of the present invention to SRAM structures in any way, but serves as a demonstration of the practicability of the present invention. Application of the features of the present invention as it is described in the exemplary SRAM cell structure to non-SRAM semiconductor structures is within the knowledge of one of ordinary skill in the art, and is herein explicitly contemplated.

Referring to FIGS. 4A-4C, a first exemplary SRAM cell structure according to a first embodiment of the present invention comprises a semiconductor substrate 10 containing two p-type field effect transistor active areas (PFET active areas) 100 and two n-type field effect transistor active areas (NFET active areas) 200. Each of the PFET active areas 100 and the NFET active areas 200 comprises an exposed portion of the semiconductor substrate 10 that are surrounded by shallow trench isolation 20. The shallow trench isolation 20 comprises a dielectric material such as silicon oxide, and is formed in the semiconductor substrate 10 employing methods well known in the art.

The semiconductor layer 10 comprises a single crystalline semiconductor material. The semiconductor material may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. Typically, the semiconductor material comprises silicon. The semiconductor substrate 10 may be a bulk substrate, a semiconductor-on-insulator (SOI) substrate, or a hybrid substrate. The semiconductor substrate 10 may have a built-in biaxial stress in the plane of the semiconductor substrate 10, i.e., in the direction of the surface normal of the top surface of the semiconductor substrate 10. While the present invention is described with a bulk substrate, implementation of the present invention on an SOI substrate or on a hybrid substrate is explicitly contemplated herein.

The silicon containing semiconductor material may be doped with electrical dopants or may be undoped, that is, substantially free of the electrical dopants. Preferably, the PFET active areas 100 are doped with n-type dopants, and the NFET active areas 200 are doped with p-type dopants. Preferably, the doping concentration of each of the PFET active areas 100 and the NFET active areas 200 are from about $1.0 \times 10^{15}/cm^3$ to about $3.0 \times 10^{18}/cm^3$. Pull-up PFETs are subsequently formed in the PFET active areas 100, and pull-down NFETs and pass gate NFETs are subsequently formed in the NFET active areas 200.

A first thermal dielectric material layer 131 is formed on top surfaces of the PFET active areas 100 and the NFET active areas 200. The first thermal dielectric material layer 131 contains a thermal dielectric material such as thermal silicon oxide, thermal silicon nitride, thermal silicon oxynitride, and a stack thereof. The first thermal dielectric material layer 131 may be formed by thermal conversion of underlying semiconductor material into a dielectric material. In case the semiconductor substrate 10 comprises silicon, the first thermal dielectric material layer may be a layer of silicon oxide, a layer of silicon nitride, a layer of silicon oxynitride, or a stack thereof. The first thermal dielectric material layer 131 may have an effective oxide thickness (EOT) from about 1 nm to about 6 nm, and typically from about 1.4 nm to about 3 nm.

Referring to FIGS. 5A-5C, a photoresist 41 is applied over the surface of the first exemplary structure and lithographically pattered so that the PFET active areas 100 are covered by the photoresist 41 and the NFET active areas 200 are exposed. The exposed portions of the first thermal dielectric layer 131, that is, the portions of the first thermal dielectric layer 131 over the NFET active area 200, are removed by an etch, which may be a wet etch or a reactive ion etch. For example, the etch may be a wet etch employing a hydrofluoric acid (HF). Semiconductor surfaces are exposed on the surfaces of the PFET active areas 100. The photoresist 41 is removed, for example, by ashing.

Referring to FIGS. 6A-6C, a second thermal dielectric material layer 132 is formed on top surfaces of the NFET active areas 200. The second thermal dielectric material layer 132 contains a thermal dielectric material such as thermal silicon oxide, thermal silicon nitride, thermal silicon oxynitride, and a stack thereof. The second thermal dielectric material layer 132 may be formed by thermal conversion of underlying semiconductor material into a dielectric material. The second thermal dielectric material layer 132 may comprise the same material as the first thermal dielectric material layer 131, or may comprise a different material from the first thermal dielectric material layer 131. For example, the first thermal dielectric material layer 131 may comprise a silicon oxynitride and the second thermal dielectric material layer 132 may comprise silicon oxide.

The second thermal dielectric material layer 132 may have an effective oxide thickness (EOT) from about 0.5 nm to about 4 nm, and typically from about 1 nm to about 2 nm. The EOT of the first thermal dielectric material layer 131 is greater than the EOT of the second thermal dielectric material layer 132.

Figure 7A:
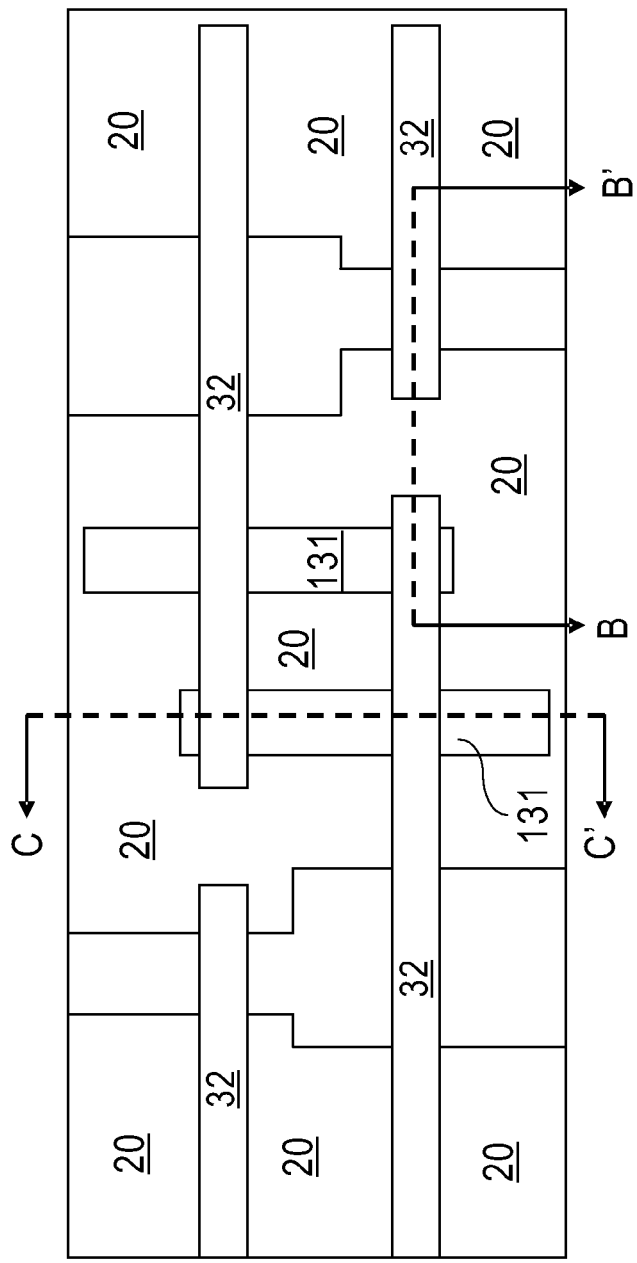
Figure 7C:
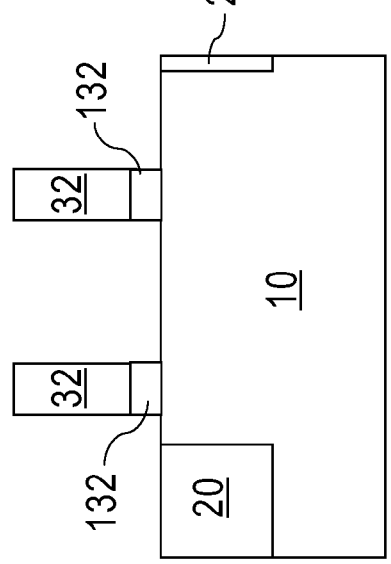
Figure 7B:
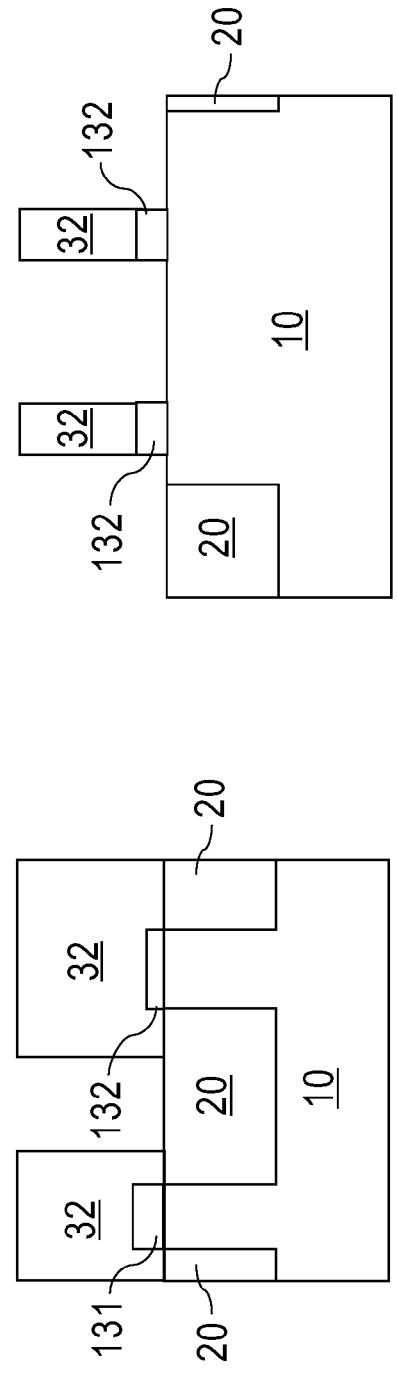

Referring to FIGS. 7A-7C, a silicon containing layer (not shown) is deposited on the first exemplary semiconductor structure. The silicon containing layer may comprise a semiconductor material selected from the group consisting of silicon, silicon-germanium alloy, silicon-carbon alloy, and silicon-germanium-carbon alloy. The silicon containing layer may comprise a polycrystalline material or an amorphous material. The silicon containing layer may be doped with electrical dopants such as boron, gallium, phosphorus, arsenic, antimony, or a combination thereof, or alternatively, the silicon containing layer may be undoped, i.e., without a substantial amount of electrical dopants. The thickness of the silicon containing layer may be in the range from about 30 nm to about 200 nm, and typically in the range from about 70 nm to about 150 nm.

The silicon containing layer is lithographically patterned and etched to form gate conductor lines 32. The portions of the first thermal dielectric layer 131 and the second thermal dielectric material layer 132 that are not covered by the gate conductor liners 32 are removed by a reactive ion etch or a wet etch. A suitable surface clean may be employed thereafter.

Referring to FIGS. 8A-8C, source and drain extension implantation and/or halo implantation may be performed to form source and drain extension regions (not shown) and/or halo regions (not shown). Gate spacers 34 are formed around each of the gate conductor lines 32 by methods well known in the art, e.g., by conformal deposition of a dielectric layer followed by a reactive ion etch (RIE). The gate spacers 34 may comprise silicon oxide, silicon nitride, silicon oxynitride, or other dielectric materials. Preferably, the thickness of the gate spacers 34, as measured at the bottom of the gate spacers, that is, adjacent to the semiconductor substrate 10, is less than ½ of the distance between adjacent gate conductor lines 32.

Optionally, stress-generating embedded materials (not shown) such as epitaxial silicon germanium alloy or silicon carbon alloy may be introduced into the PFET active areas 100 and/or the NFET active areas 200 by recessing the exposed portions of the PFET active areas 100 and/or the NFET active areas 200 and epitaxially growing the stress-generating materials, Source and drain regions (not shown) are formed by mask implantation of dopants into the exposed portions of the PFET active areas 100 and the NFET active areas 200. P-type dopants are implanted into the PFET active areas 100, and n-type dopants are implanted into the NFET active areas 200. The source and drain regions are heavily doped with a typical dopant concentration from about $3.0 \times 10^{19}/cm^3$ to about $3.0 \times 10^{21}/cm^3$.

Silicide alloys are formed on the exposed semiconductor surfaces by depositing a metal layer (not shown) and reacting the metal layer with the underlying silicon containing semiconductor material during a silicidation process, as is well known in the art. The silicidation process comprises at least one anneal for silicide alloy formation and may comprise multiple anneals to optimize the quality of the silicide alloys. The metal layer is subsequently removed, for example, by a wet etch. If the underlying silicon containing material is silicon, a metal silicide is formed. If the underlying silicon containing material is an alloy of silicon with other material, a silicide alloy is formed. If the other material comprises germanium and/or carbon, the silicide alloy comprises silicide-germanide alloy and/or silicide-carbide alloy. Some silicon containing material is consumed to provide silicon material to the silicide alloy during the silicidation process. Active area silicide alloy regions 60 and gate conductor silicide alloy regions 64 are formed during the silicidation process.

A middle-of-line (MOL) dielectric 70 is deposited on the semiconductor substrate 10 and planarized. The MOL dielectric may be undoped silicate glass (USG), fluorosilicate glass (FSG), borophosphosilicate glass (BPSG), a spin-on low-k dielectric layer, or a chemical vapor deposition (CVD)) low-k dielectric layer. FIG. 8A does not show the MOL dielectric 70 for clarity, while FIGS. 8B and 8C show the MDL dielectric 70. Contact via holes are formed in the MOL dielectric 70 and are filled with metal to form CA contact vias 76 and CA contact bars 78.

In the first exemplary SRAM cell structure shown in FIGS. 8A-8C, two pull-up PFETs (16, 16') comprises a PFET gate dielectric containing a first thermal dielectric material layer 131 having a first equivalent oxide thickness (EOT), and two pull-down NFETs (14, 14') and two pass gate NFETs (12, 12') comprise an NFET gate dielectric containing a second thermal dielectric material layer 132 having a second equivalent oxide thinness (EOT). The first EOT is greater than the second EOT. By providing a greater EOT to the gate dielectric of the two pull-up PFETs relative to the gate dielectric of the NFETs (12, 12' 14, 14'), the on-current of the two pull-up PFETs (16, 16') is relatively reduced for optimal performance of the SRAM cell in the first exemplary SRAM cell structure.

Referring to FIGS. 9A-C, a second exemplary SRAM cell structure according to a second embodiment of the present invention comprises a semiconductor substrate 10 containing two p-type field effect transistor active areas (PFET active areas) 100, two n-type field effect transistor active areas (NFET active areas) 200, and shallow trench isolation 20. The structural and material properties of the PFET active areas 100, the NFET active areas 200, and the shallow trench isolation 20 are the same as in the first exemplary SRAM cell structure.

A thermal dielectric material layer 133 is formed on top surfaces of the PFET active areas 100 and the NFET active areas 200. The thermal dielectric material layer 133 contains a thermal dielectric material such as thermal silicon oxide, thermal silicon nitride, thermal silicon oxynitride, and a stack thereof. The first thermal dielectric material layer 133 may comprise the same material and may be formed by the same methods as the first thermal dielectric material layer 131 of the first exemplary SRAM cell structure. The thermal dielectric material layer 133 may have an effective oxide thickness (EOT) from about 0.5 nm to about 6 nm, and typically from about 1 nm to about 3 nm.

Referring to FIGS. 10A-10C, a photoresist 41 is applied over the surface of the second exemplary structure and lithographically patterned so that the PFET active areas 100 are covered by the photoresist 41 and the NFET active areas 200 are exposed. The exposed portions of the thermal dielectric layer 133, that is, the portions of the thermal dielectric layer 131 over the PFET active area 100, are removed by an etch, which may be a wet etch or a reactive ion etch. Semiconductor surfaces are exposed on the surfaces of the PFET active areas 100. The photoresist 41 is removed, for example, by ashing.

Figure 11C:
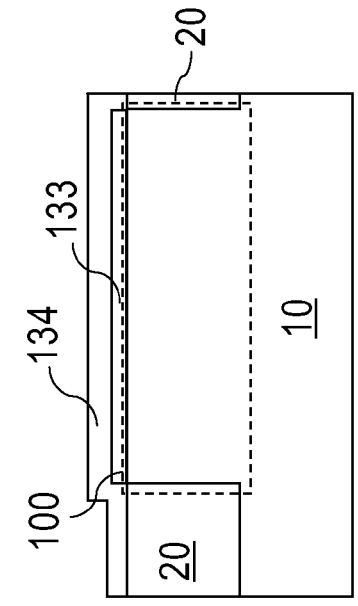
Figure 11A:
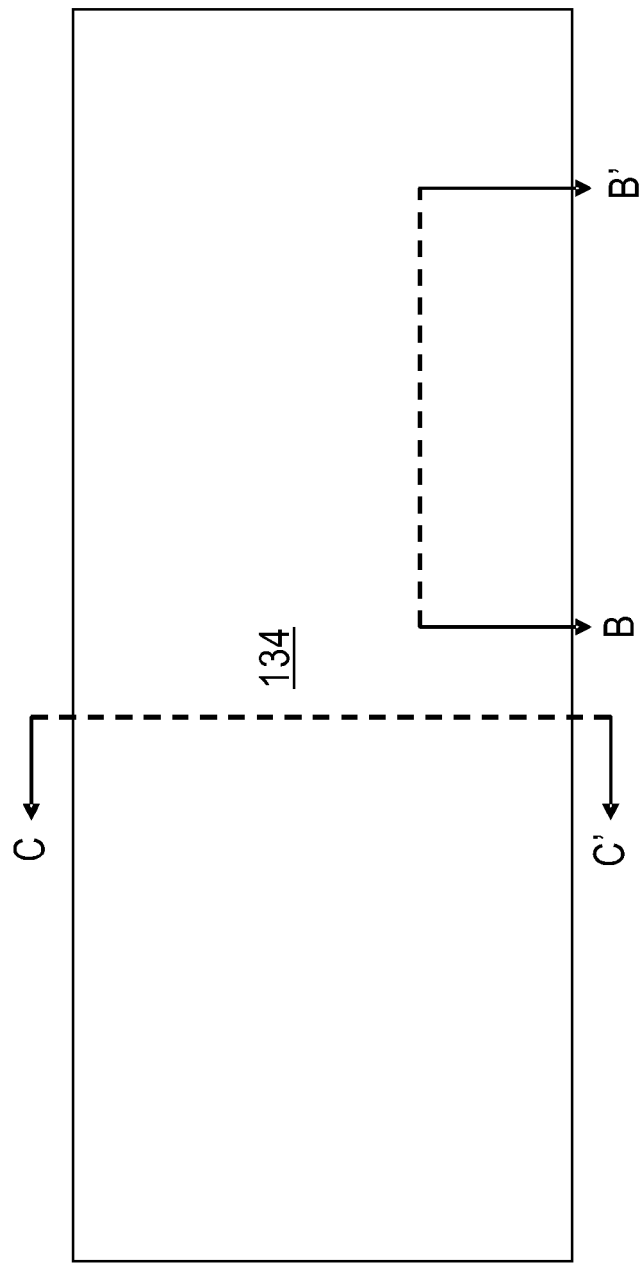
Figure 11B:
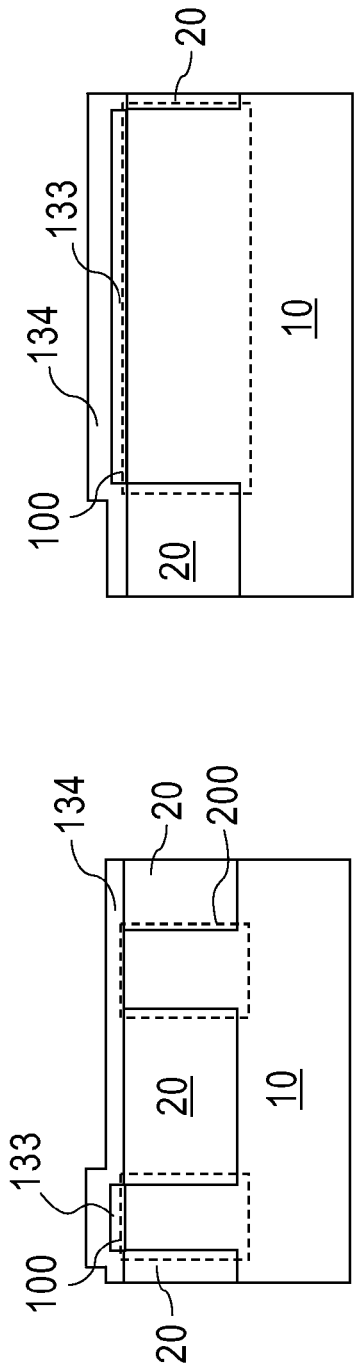

Referring to FIGS. 11A-11C, a high-K dielectric material layer 134 is formed directly on the thermal dielectric layer 133 above the PFET active areas 100 and directly on the top surfaces of the NFET active areas 200 and the shallow trench isolation 20. The high-k dielectric material layer 134 comprises a dielectric metal oxide having a dielectric constant that is greater than the dielectric constant of silicon oxide of 3.9. The dielectric metal oxide is a high-k material containing a metal and oxygen. The high-K dielectric material layer 134 may comprise a high-K dielectric material such as $HfO_2$, $ZrO_2$, $Al_2O_3$, $TiO_2$, $La_2O_3$, $SrTiO_3$, $LaAlO_3$, $Y_2O_3$, mixtures thereof, and silicates thereof An example of a high-K dielectric material comprising a mixture is $P_xQ_{1-x}$, wherein each of P and Q are selected from the group consisting of $HfO_2$, $ZrO_2$, $Al_2O_3$, $TiO_2$, $La_2O_3$, $SrTiO_3$, $LaAlO_3$, and $Y_2O_3$, and x has a value between 0 and 1. An example of a high-K dielectric material comprising a silicate is $D_y(SiO_2)_{1-y}$, wherein D is selected from the group consisting of $HfO_2$, $ZrO_2$, $Al_2O_3$, $TiO_2$, $La_2O_3$, $SrTiO_3$, $LaAlO_3$, $Y_2O_3$, and mixtures thereof, and y has a value between 0 and 1. Ternary and quaternary mixtures and silicates are explicitly contemplated herein.

The high-k dielectric material layer 134 may be formed by methods well known in the art including, for example, a chemical vapor deposition (CVD), an atomic layer deposition (PVD), molecular beam epitaxy (MBE), pulsed laser deposition (PLD), liquid source misted chemical deposition (LSMCD), etc. Non-stoichiometric variants of the dielectric metal oxides as well as substantially stoichiometric compounds described above as a material for the high-k dielectric material layer 134 are explicitly contemplated herein. The thickness of the high-k dielectric material layer 134 may be from about 2 nm to about 6 nm, and may have an effective oxide thickness (EOT) on the order of or less than 1 nm. The high-k dielectric material layer 134 may have an effective oxide thickness (EOT) from about 0.5 nm to about 4 nm, and typically from about 1 nm to about 2 nm.

A metal gate layer (not shown) is formed directly on the high-k dielectric material layer 134, for example, by chemical vapor deposition (CVD), physical vapor deposition (PVD), atomic layer deposition (ALD), etc. The metal gate layer comprises a conductive refractory metal nitride. For example, the metal gate layer may comprise a material such as TaN, TiN, WN, TiAlN, TaCN, other conductive refractory metal nitride, or an alloy thereof. The thickness of the metal gate layer may be from about 5 nm to about 40 nm, and preferably from about 7 nm to about 20 nm, although lesser and greater thicknesses are contemplated herein.

Optionally, a silicon containing gate conductor layer (not shown) is formed directly on the metal gate layer, for example, by low pressure chemical vapor deposition (LPCVD), rapid thermal chemical vapor deposition (RTCVD), etc. It is understood that an amorphous silicon containing gate conductor layer may be alternatively deposited at this point and subsequently annealed to form the silicon containing gate conductor layer.

The silicon containing gate conductor layer may comprise a silicon containing material such as amorphous silicon, an amorphous silicon containing alloy, polysilicon and/or a polycrystalline silicon containing alloy. Exemplary silicon containing alloys are silicon germanium alloy, silicon carbon alloy, and silicon germanium carbon alloy. The silicon containing material may be doped with dopants such as B, Ga, In, P, As, and/or Sb, or may be substantially undoped. The silicon containing material may be differentially doped between the portions of the silicon containing gate conductor layer above the PFET active area 100 and the portions of the silicon containing gate conductor layer above the NFET active area 200. The thickness, i.e., the height, of the silicon containing gate conductor layer may vary depending on the technique used in forming the same. The silicon containing gate conductor layer may have a thickness from about 20 to about 200 nm, with a thickness from about 40 to about 150 nm being more typical.

Figure 12A:
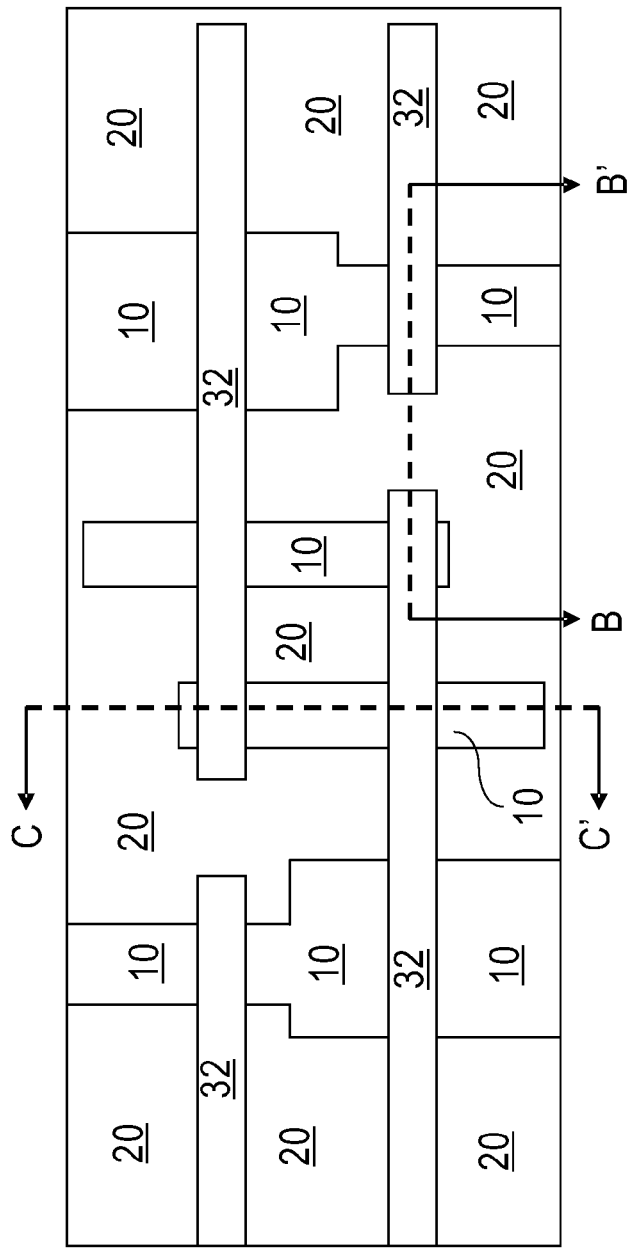
Figure 12C:
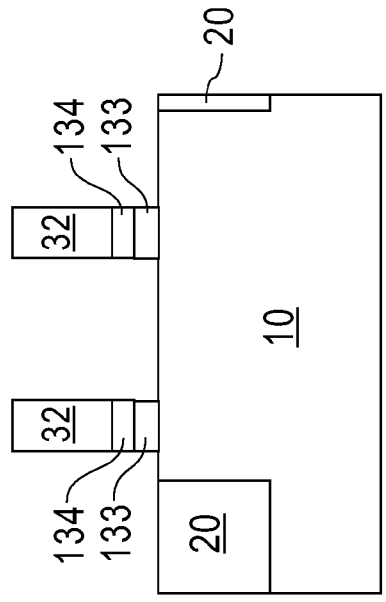
Figure 12B:
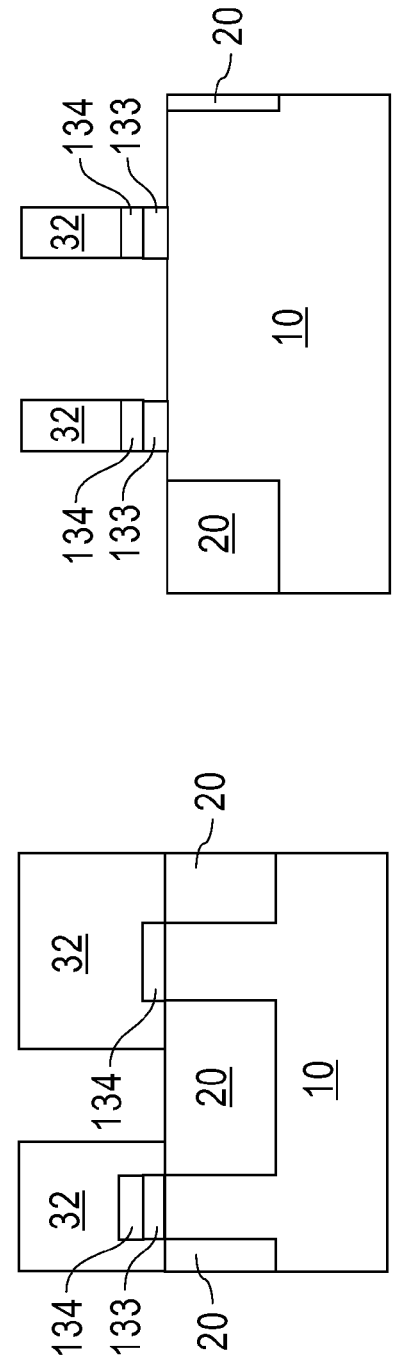

Referring to FIGS. 12A-12C, the metal gate layer and the optional silicon containing gate conductor layer are lithographically patterned and etched to form gate conductor lines 32. The portions of the high-K dielectric material layer 134 and the thermal dielectric layer 133 that are not covered by the gate conductor liners 32 are removed by a reactive ion etch or a wet etch. A suitable surface clean may be employed thereafter.

Figure 13A:
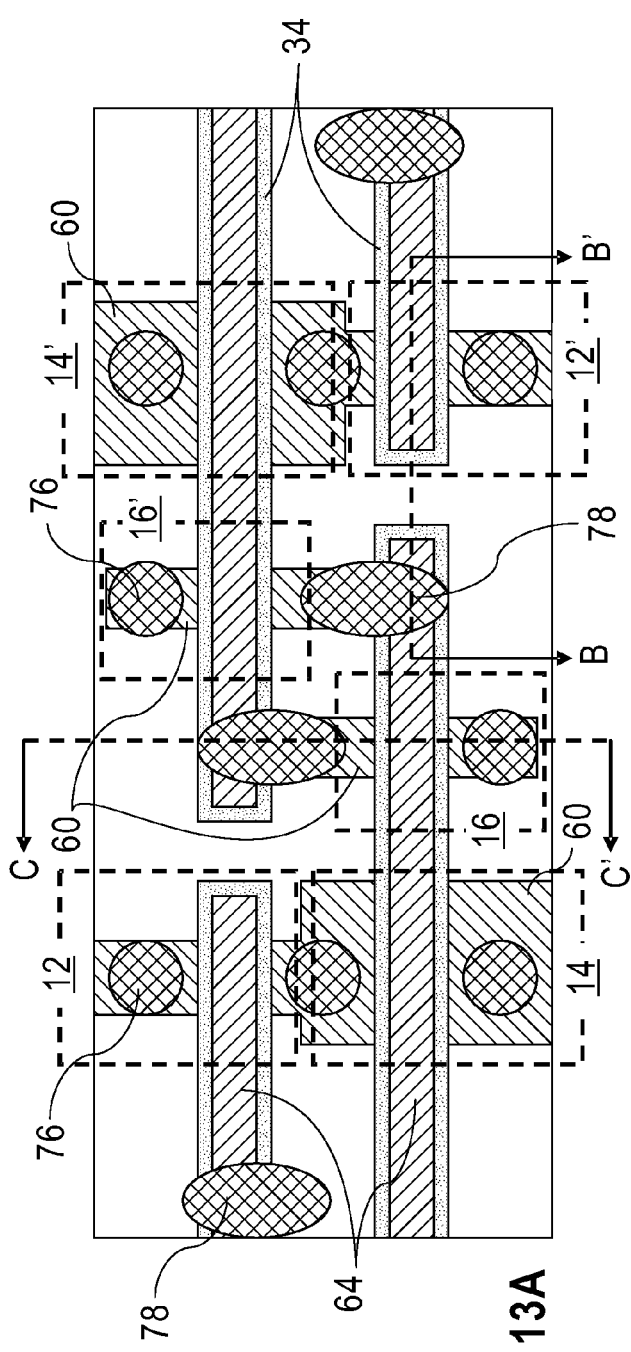
Figure 13C:
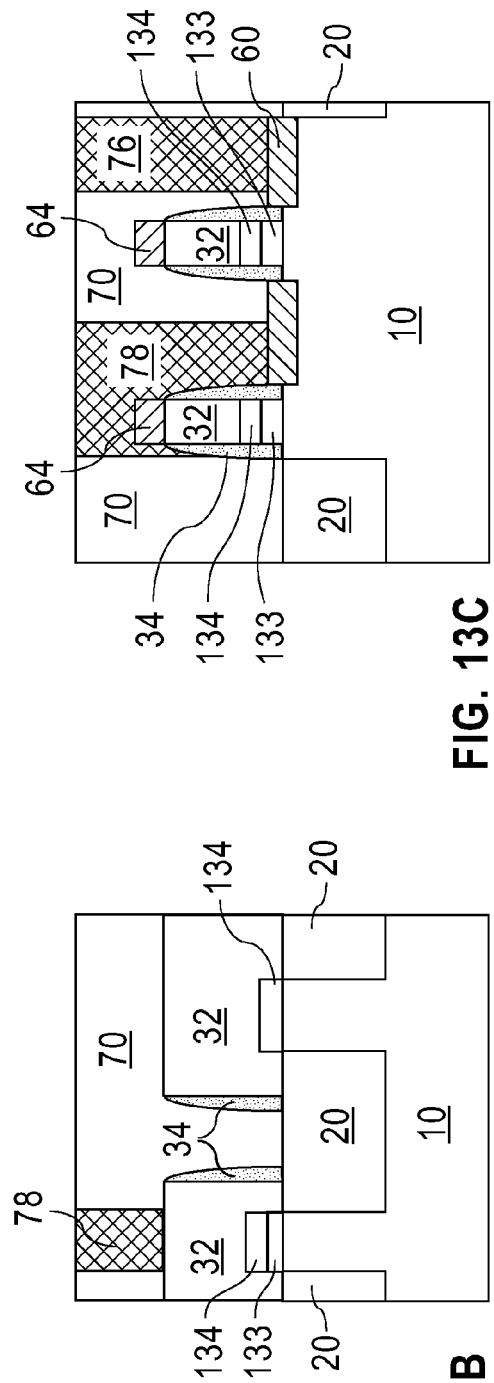
Figure 13B:
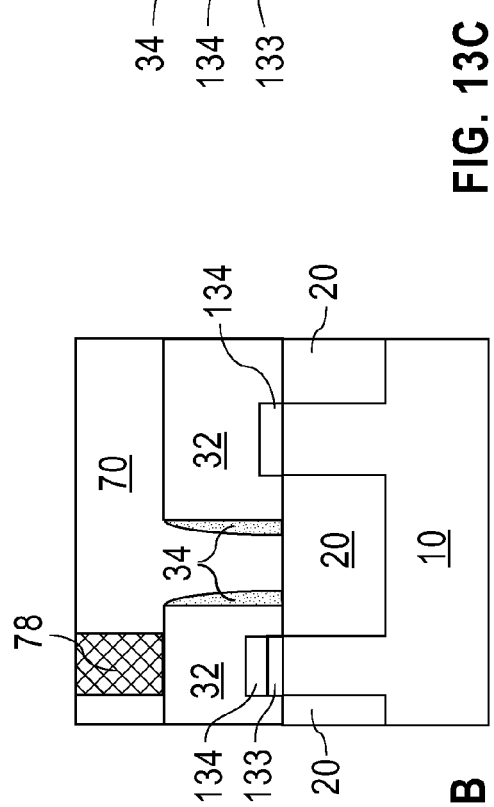

Referring to FIGS. 13A-13C, source and drain extension regions (not shown), halo regions (not shown), gate spacers 34, and/or source and drain regions (not shown) may be formed in the second exemplary SRAM cell structure as in the first embodiment. Optionally, stress-generating embedded materials (not shown) may be introduced into the second exemplary semiconductor structure. Silicide alloy regions including active area silicide alloy regions 60 and gate conductor silicide alloy regions 64 are formed during a silicidation process as in the first embodiment. A middle-of-line (MOL) dielectric 70 is deposited on the semiconductor substrate 10 and planarized. FIG. 13A does not show the MOL dielectric 70 for clarity, while FIGS. 13B and 13C show the MOL dielectric 70. Contact via holes are formed in the MOL dielectric 70 and are filled with metal to form CA contact vias 76 and CA contact bars 78 as in the first embodiment.

In the second exemplary SRAM cell structure shown in FIGS. 13A-13C, two pull-up PFETs (16, 16') comprises a PFET gate dielectric containing a thermal dielectric material layer 133 and a high-K dielectric material layer 134, and two pull-down NFETs (14, 14') and two pass gate NFETs (12, 12') comprise an NFET gate dielectric containing only the high-K dielectric material layer 134 having a second equivalent oxide thickness (EOT). The gate stack of the two pull-up PFETs has a first equivalent oxide thickness (EOT), which is the sum of the EOT of the thermal dielectric material layer 133 and the second EOT. Thus, the first EDT is greater than the second EOT. Relative reduction of the on-current of the pull-up PFETs is effected in the second exemplary SRAM cell structure as in the first exemplary SRAM cell structure.

Figure 14A:
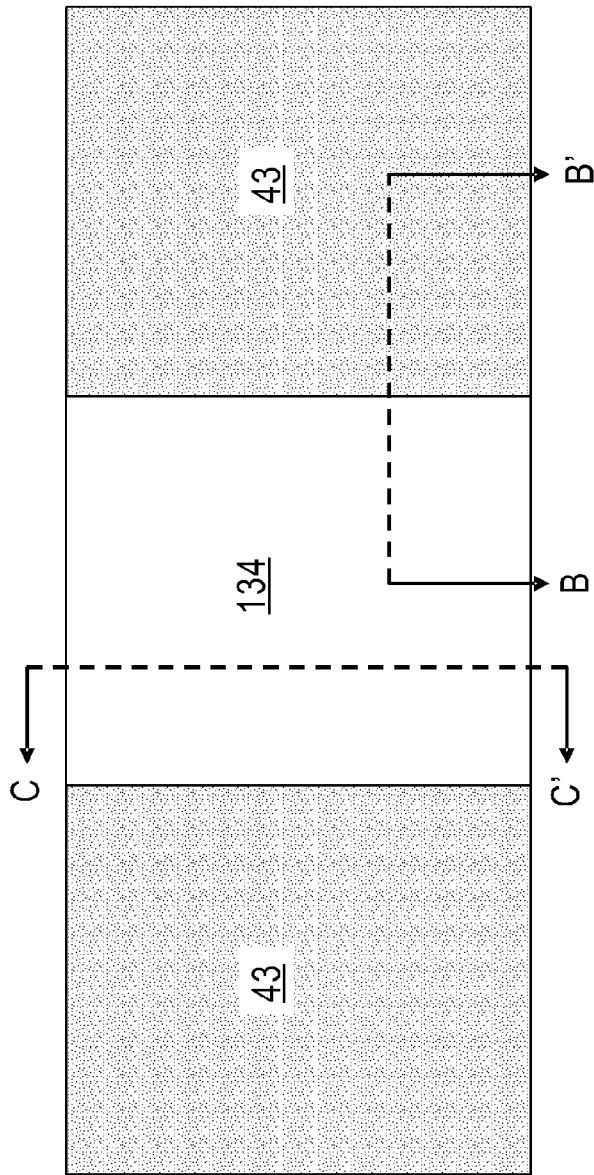
Figure 14C:
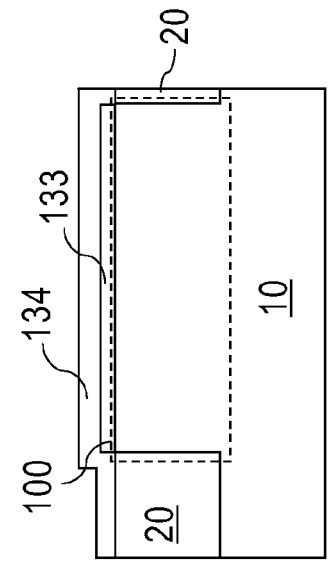
Figure 14B:
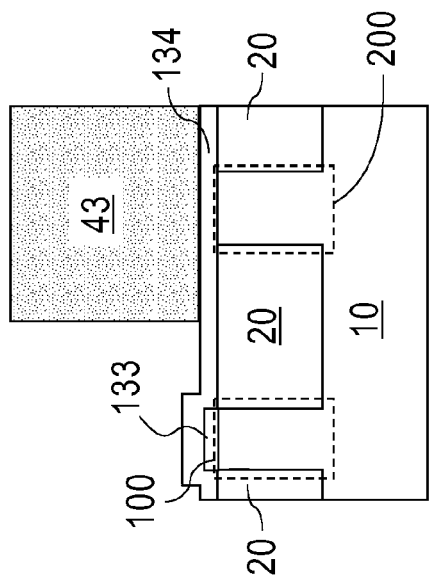

Referring to FIGS. 14A-14C, a third exemplary SRAM cell structure according to a third embodiment of the present invention is derived from the second exemplary structure of FIGS. 11A-11B. In the third embodiment, the thicknesses of the thermal dielectric material layer 133 and a high-K dielectric material layer 134 are adjusted such that the equivalent oxide thickness (EOT) of the thermal dielectric material layer 133 exceeds the equivalent oxide thickness (EOT) of the high-K dielectric material layer 134. The thermal dielectric material layer 133 may have an EOT from about 1 nm to about 6 nm, and typically from about 1.4 nm to about 3 nm. The high-K dielectric material layer 134 may have an EOT from about 0.5 nm to about 4 nm, and typically from about 1 nm to about 2 nm.

A second photoresist 43 is applied over the surface of the high-K dielectric material layer 134 and patterned to cover the NFET active areas 200, while exposing the PFET active areas 100. The exposed portions of the high-K dielectric material layer 134 is etched by a wet etch or a reactive ion etch selective to the thermal dielectric material layer 133. The second photoresist 43 is thereafter removed, for example, by ashing. A suitable surface cleaning may be performed at this step.

Figure 15A:
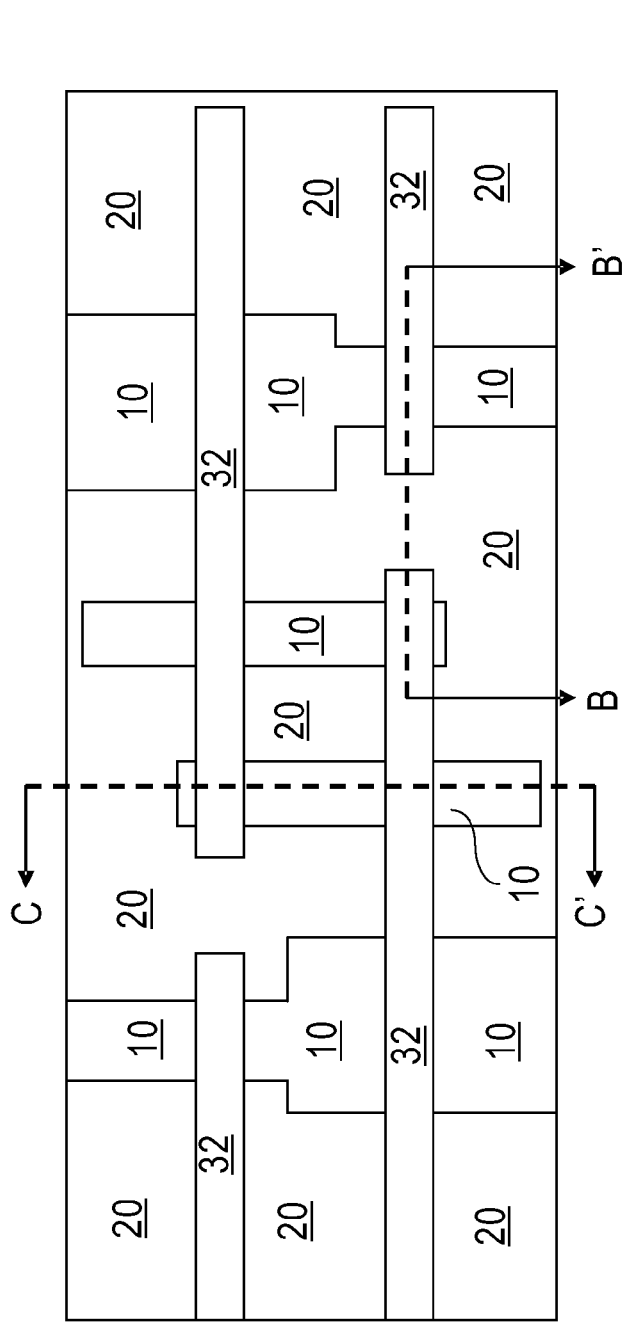
Figure 15C:
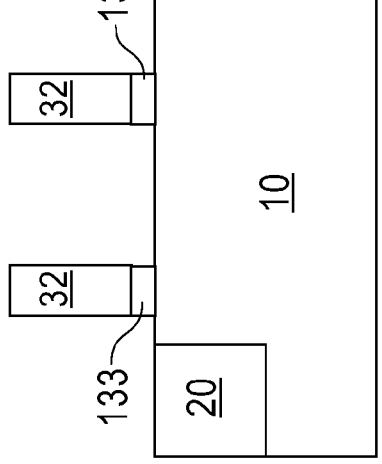
Figure 15B:
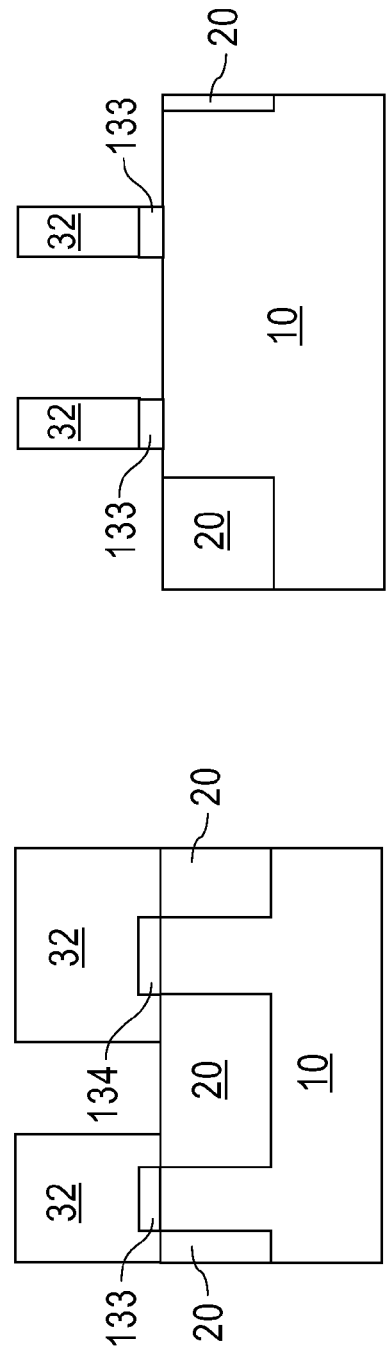

Referring to FIGS. 15A-15C, gate conductor lines 32 are formed by one of the methods of forming gate conductor lines 32 in the first and second embodiments. The gate conductor lines 32 may comprise a silicon containing material as in the first embodiment. Alternatively, the gate conductor lines 32 may comprise a stack of a conductive refractory metal nitride and a silicon containing material as in the second embodiment.

Referring to FIGS. 16A-16C, source and drain extension regions (not shown), halo regions (not shown), gate spacers 34, and/or source and drain regions (not shown), optional stress-generating embedded material regions (not shown), active area silicide alloy regions 60, gate conductor silicide alloy regions 64, a middle-of-line (MOL) dielectric 70, CA contact vias 76 and/or CA contact bars 78 are formed as in the first and second embodiments. FIG. 16A does not show the MOL dielectric 70 for clarity, while FIGS. 16B and 16C show the MOL dielectric 70.

In the third exemplary SRAM cell structure shown in FIGS. 16A-16C, two pull-up PFETs (16, 16') comprises a PFET gate dielectric containing a thermal dielectric material layer 133 having a first equivalent oxide thickness (EOT) and abutting the semiconductor substrate 10, and two pull-down NFERTs (14, 14') and two pass gate NFETs (12, 12') comprise an NFET gate dielectric containing the high-K dielectric material layer 134 having a second equivalent oxide thickness (EOT) and abutting the semiconductor substrate 10. The first EOT is greater than the second EROT. Relative reduction of the on-current of the pull-up PFETs is effected in the second exemplary SRAM cell structure as in the first and second exemplary SRAM cell structures.

Referring to FIGS. 17A-17C, a fourth exemplary SRAM cell structure according to a fourth embodiment of the present invention comprises a semiconductor substrate 10 containing two p-type field effect transistor active areas (PFET active areas) 100, two n-type field effect transistor active areas (NFET active areas) 200, and shallow trench isolation 20 as the first exemplary semiconductor structure. Instead of forming a first thermal dielectric material layer 131, a stack of a high-K dielectric material layer 135 and a second dielectric material layer 136.

The high-K dielectric material layer 135 may comprise a high-K dielectric material such as $HfO_2$, $ZrO_2$, $Al_2O_3$, $TiO_2$, $La_2O_3$, $SrTiO_3$, $LaAlO_3$, $Y_2O_3$, mixtures thereof, and silicates thereof. The high-K dielectric material layer 135 may be formed by the same methods as the high-K dielectric material layer 134 in the second and third embodiments of the present invention. The high-k dielectric material layer 135 may have an effective oxide thickness (EOT) from about 0.5 nm to about 4 nm, and typically from about 1 nm to about 2 nm.

The second dielectric material layer 136 may comprise another high-K dielectric material such as $HfO_2$, $ZrO_2$, $Al_2O_3$, $TiO_2$, $La_2O_3$, $SrTiO_3$, $LaAlO_3$, $Y_2O_3$, mixtures thereof, and silicates thereof. Preferably, the second dielectric material layer 136 comprises a different material than the high-K dielectric material layer 135. The second dielectric material layer 136 may have an effective oxide thickness (EOT) from about 0.5 nm to about 4 nm, and typically from about 0.5 nm to about 2 nm.

In a variation of the fourth embodiment, the second dielectric material layer 136 may comprise a chemical vapor deposition (CVD) dielectric layer comprising a dielectric material such as silicon oxide, silicon nitride, or silicon oxynitride. The CVD dielectric layer is formed by a chemical vapor deposition of a dielectric material. Low pressure chemical vapor deposition (LPCVD), rapid thermal chemical vapor deposition (RTCVD), and/or plasma enhanced chemical vapor deposition (PECVD) may be employed. The effective oxide thickness (EOT) of the CVD dielectric layer may be from about 1 nm to about 4 nm, and typically from about 1 nm to about 2 nm.

Referring to FIGS. 18A-18C, a photoresist 41 is applied over the surface of the fourth exemplary structure and lithographically pattered so that the PFET active areas 100 are covered by the photoresist 41 and the NFET active areas 200 are exposed. The exposed portions of the second dielectric material layer 136, that is, the portions of the second dielectric material layer 136 over the NFET active area 100, are removed by an etch, which may be a wet etch or a reactive ion etch. The etch is selective to the high-K dielectric material layer 135, i.e., the etch removes the exposed portions of the second dielectric material layer 136, while not removing the high-K dielectric material layer 135. The photoresist 41 is thereafter removed, for example, by ashing. A suitable surface cleaning may be performed at this step.

Figure 19A:
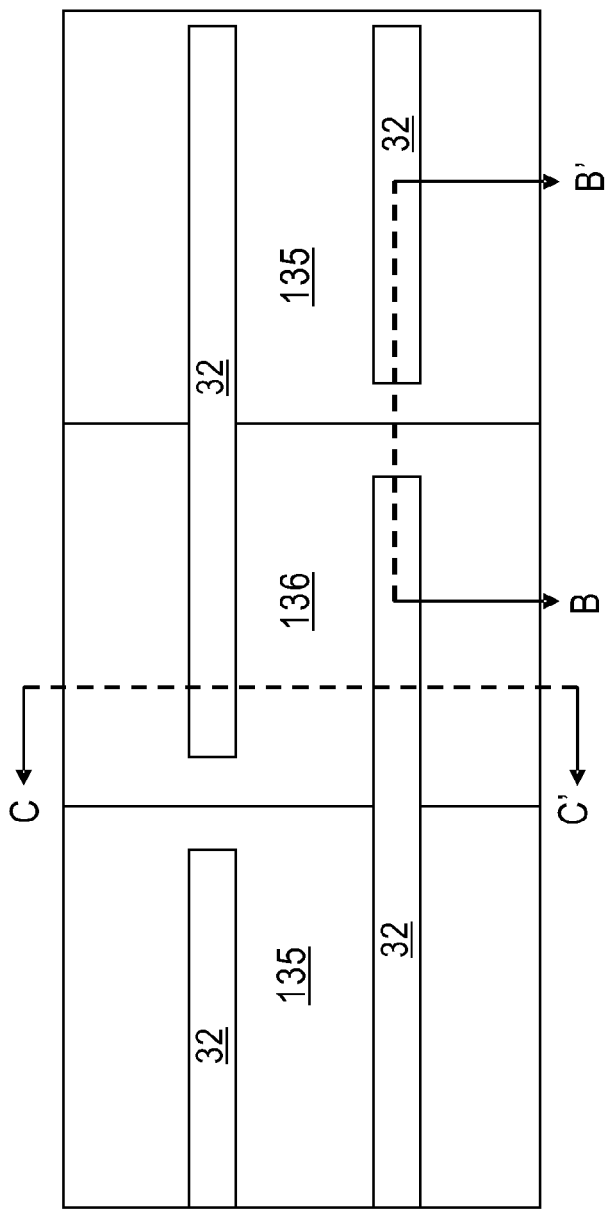
Figure 19C:
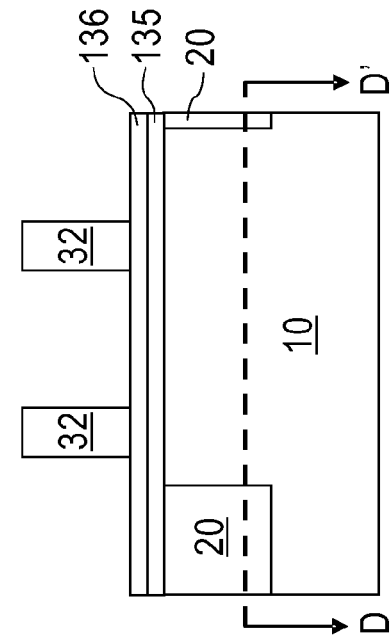
Figure 19B:
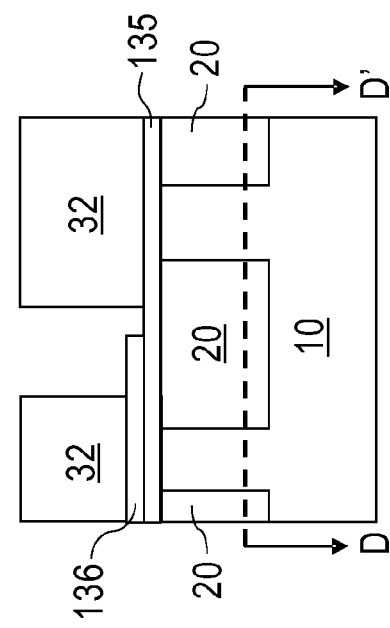
Figure 19D:
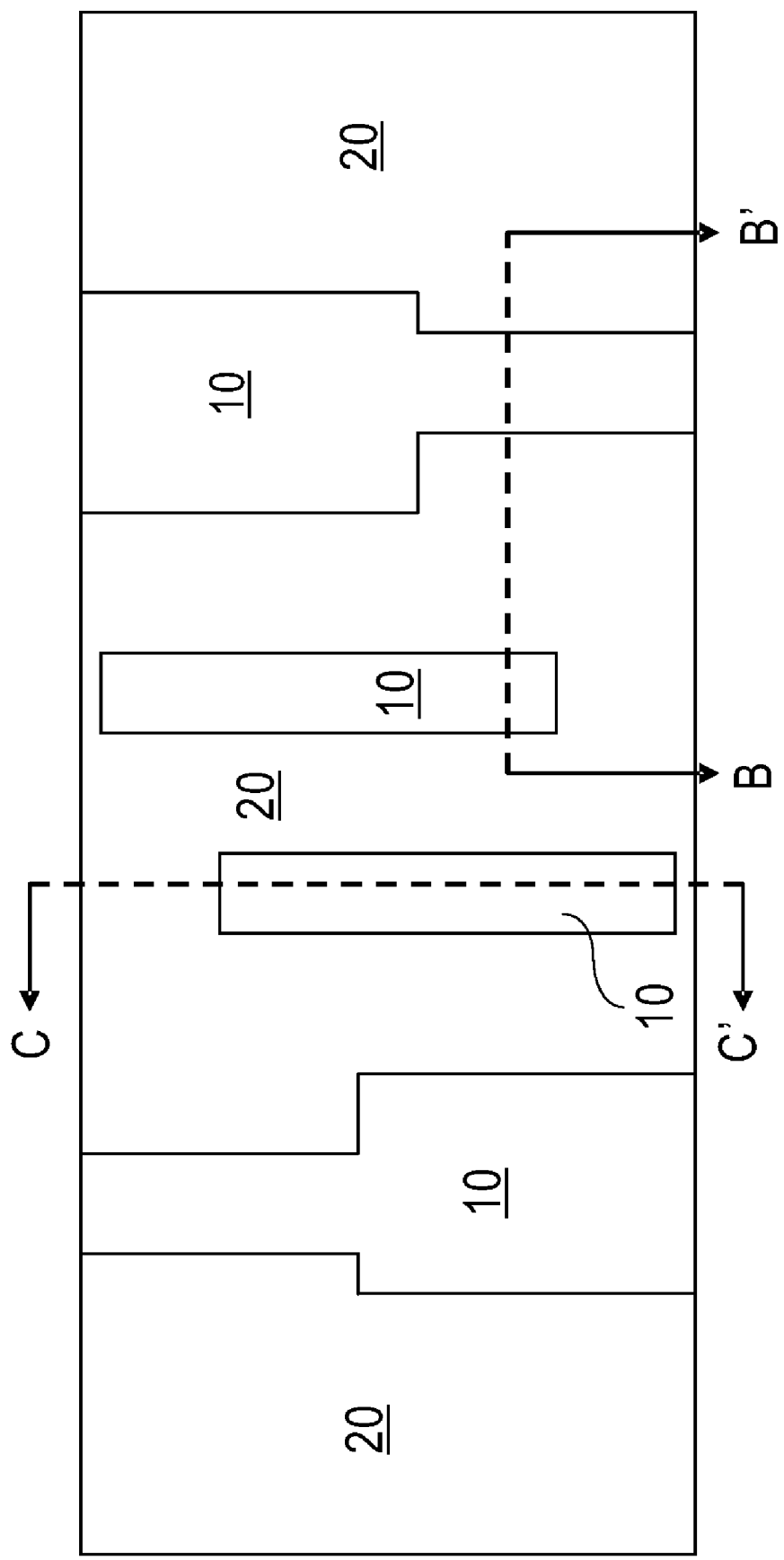
FIG. 19D is a horizontal cross-sectional view of the fourth exemplary structure along the plane D-D' in FIGS. 19B and 19C.

Referring to FIGS. 19A-19D, the fourth exemplary structure is show after formation of gate conductor lines 32 and prior to etching the second dielectric material layer 136 and/or the high-K dielectric material layer 135. The gate conductor lines 32 may be formed by one of the methods of forming gate conductor lines 32 in the first and second embodiments. FIG. 19D is a horizontal cross-sectional view of the fourth exemplary structure along the plane D-D'. The gate conductor lines 32 may comprise a silicon containing material as in the first embodiment. Alternatively, the gate conductor lines 32 may comprise a stack of a conductive refractory metal nitride and a silicon containing material as in the second embodiment.

Figure 20A:
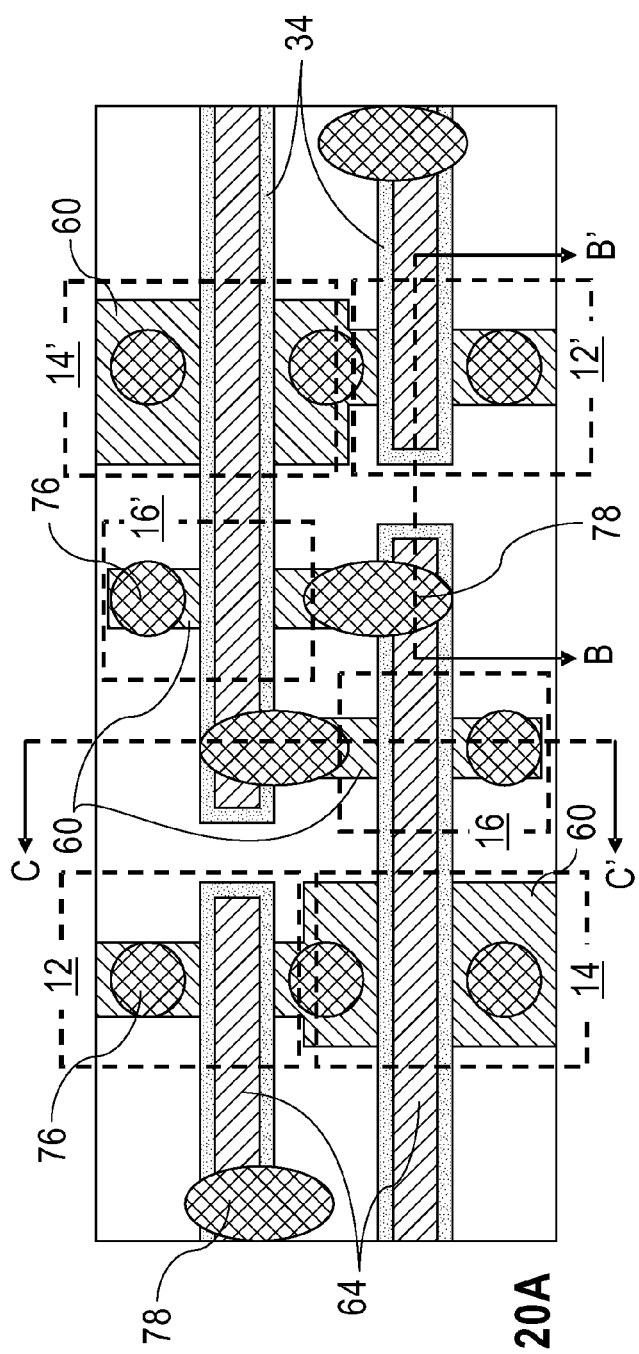
Figure 20C:
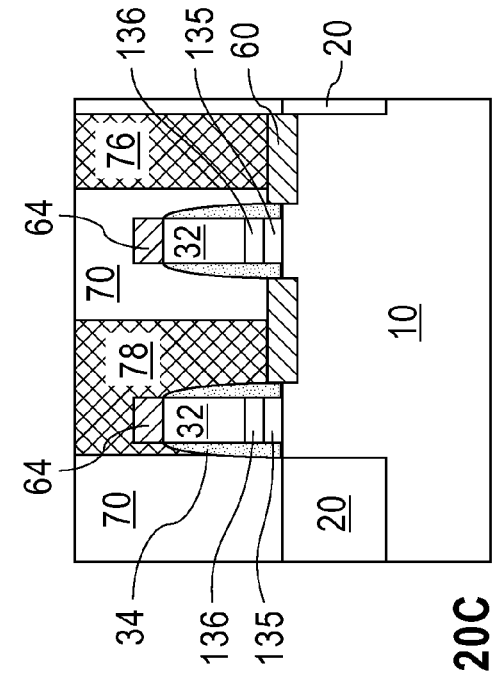
Figure 20B:
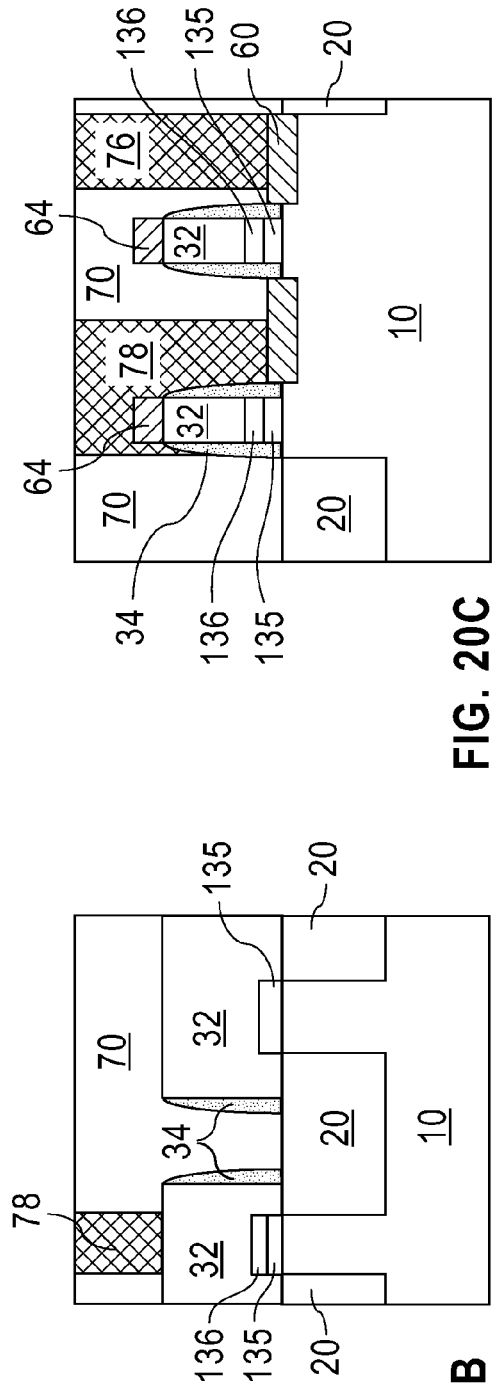

Referring to FIGS. 20A-20C, source and drain extension regions (not shown), halo regions (not shown), gate spacers 34, and/or source and drain regions (not shown), optional stress-generating embedded material regions (not shown), active area silicide alloy regions 60, gate conductor silicide alloy regions 64, a middle-of-line (MOL) dielectric 70, CA contact vias 76 and/or CA contact bars 78 are formed as in the first, second, and third embodiments. FIG. 20A does not show the MOL dielectric 70 for clarity, while FIGS. 20B and 20C show the MOL dielectric 70.

In the fourth exemplary SRAM cell structure shown in FIGS. 20A-20C, two pull-up PFETs (16, 16') comprises a PFET gate dielectric containing a stack of the high-K dielectric material layer 135 and the second dielectric material layer 136, and two pull-down NFETs (14, 14') and two pass gate NFETs (12, 12') comprise an NFET gate dielectric containing only the high-K dielectric material layer 135 having a second equivalent oxide thickness (LOT). The PFET gate dielectric has a first equivalent oxide thickness (EOT) which is the sum of the equivalent oxide thickness (EOT) of the second gate dielectric material layer 136 and the second EOT. Thus, the first EOT is greater than the second EOT. Relative reduction of the on-current of the pull-up PFETs is effected in the fourth exemplary SRAM cell structure.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of manufacturing a static random access memory cell, said method comprising:
   providing two p-type field effect transistor (PFET) active areas and two n-type field effect transistor (NFET) active areas on a semiconductor substrate;
   forming a PFET gate dielectric on said PFET active areas, wherein said PFET gate dielectric has a first equivalent oxide thickness (EOT); and
   forming an NFET gate dielectric on said NFET active areas, wherein said NFET gate dielectric has a second equivalent oxide thickness (EOT), and wherein said first EOT is greater than said second EOT, and wherein said PFET active areas and said NFET active areas constitute portions of a single static random access memory cell.

2. The method of claim 1,
   wherein said forming of said PFET gate dielectric comprises forming a thermal dielectric material layer containing a thermal dielectric material on said PFET active areas and said NFET active areas, wherein said thermal dielectric material is selected from the group consisting of thermal silicon oxide, thermal silicon nitride, thermal silicon oxynitride, and a stack thereof; and
   wherein said forming of said NFET gate dielectric comprises:
   removing said thermal dielectric material layer from above said NFET active areas, and
   forming another thermal dielectric material layer comprising another thermal dielectric material, wherein said another thermal dielectric material is selected from the group consisting of thermal silicon oxide, thermal silicon nitride, thermal silicon oxynitride, and a stack thereof.

3. The method of claim 2, wherein said thermal dielectric material is comprises a different from said another thermal dielectric material.

4. The method of claim 1,
   wherein said forming of said PFET gate dielectric comprises:
   forming a thermal dielectric material layer containing a thermal dielectric material on said PFBT active areas and said NFET active areas, wherein said thermal dielectric material is selected from the group consisting of thermal silicon oxide, thermal silicon nitride, thermal silicon oxynitride, and a stack thereof, and
   forming a high-K dielectric material layer having a dielectric constant greater than 3.9 directly on said thermal dielectric layer above said PFET active areas; and
   wherein said forming of said NFET gate dielectric comprises:
   removing said thermal dielectric material layer from above said NFET active areas, and
   forming said high-K dielectric material layer directly on said NFET active areas.

5. The method of claim 4, wherein said high-K dielectric material layer comprises a material selected from the group consisting of $HfO_2$, $ZrO_2$, $Al_2O_3$, $TiO_2$, $La_2O_3$, $SrTiO_3$, $LaAlO_3$, $Y_2O_3$, mixtures thereof, and silicates thereof.

6. The method of claim 4, further comprising removing said high-K dielectric material layer from above said PFET active areas.

7. The method of claim 4,
   wherein said forming of said PFET gate dielectric comprises:
   forming a first high-K dielectric material layer having a dielectric constant greater than 3.9 directly on said PFET active areas and said NFET areas, and
   forming a second high-K dielectric material layer having a dielectric constant greater than 3.9 directly on said first high-K dielectric material layer above said PFET areas and said NFET areas; and
   wherein said forming of said NFET gate dielectric comprises removing said second high-K dielectric material layer from above said NFET active areas.

8. The method of claim 7, wherein each of said first high-K dielectric material layer and said second high-K dielectric material layer comprises a material selected from the group consisting of $HfO_2$, $ZrO_2$, $Al_2O_3$, $TiO_2$, $La_2O_3$, $SrTiO_3$, $LaAlO_3$, $Y_2O_3$, mixtures thereof, and silicates thereof.

9. The method of claim 7, wherein said first high-K dielectric material layer and said second high-K dielectric material layer comprise different materials.

10. The method of claim 4,
    wherein said forming of said PFET gate dielectric comprises:
    forming a high-K dielectric material, layer having a dielectric constant greater than 3.9 directly on said PFET active areas and said NFET areas,
    forming a chemical vapor deposition (CVD) dielectric layer directly on said first high-K dielectric material layer above said PFET areas and said NFET areas by chemical vapor deposition; and
    wherein said forming of said NFET gate dielectric comprises removing said CVD dielectric layer from above said NFET active areas.

* * * * *